United States Patent [19]

Kwilos

[11] Patent Number: 4,618,194
[45] Date of Patent: Oct. 21, 1986

[54] CONNECTING BLOCK FOR DIGITAL SYSTEM CROSS-CONNECT FRAME

[75] Inventor: Jerald J. Kwilos, Ironia, N.J.

[73] Assignee: AT&T Bell Laboratories, Murray Hill, N.J.

[21] Appl. No.: 755,152

[22] Filed: Jul. 15, 1985

[51] Int. Cl.$^4$ .......................... H04Q 1/14; H01R 9/09; H01R 25/00
[52] U.S. Cl. .................................. 339/14 R; 179/98; 339/17 LM; 339/128; 361/428
[58] Field of Search .................. 339/14 R, 17 R, 17 C, 339/17 L, 17 LM, 17 M, 18 R, 18 B, 18 C, 125, 126, 128, 198 R, 198 P, 198 S; 179/96–98; 361/426–428

[56] References Cited

U.S. PATENT DOCUMENTS

| | | | |
|---|---|---|---|
| 3,509,297 | 4/1970 | King | 200/51 |
| 4,146,755 | 3/1979 | Causse | 179/98 |
| 4,235,501 | 11/1980 | Ericsson | 339/191 M |
| 4,260,856 | 4/1981 | Saligny | 179/98 |
| 4,269,463 | 5/1981 | Beatenbough | 339/91 R |
| 4,536,052 | 8/1985 | Baker et al. | 339/126 R |

OTHER PUBLICATIONS

Switchcraft DSX Jackfield-NPB 375, Switchcraft, Inc., 1984, Chicago, Ill., pp. 1–4.

Primary Examiner—Neil Abrams
Attorney, Agent, or Firm—Patrick E. Roberts; Robert O. Nimtz

[57] ABSTRACT

A connecting block for a digital cross connect system has printed wiring circuit boards to interconnect terminals on the rear surface with jacks and terminals on the front surface. The terminals on the front surface are multipled to jack appearances also on the front surface of the connecting block. The connecting block has a pedestal which sits on a lower crossarm of a frame. The upper surface of the connecting block has a resilient tang which snaps into an upper crossarm of the frame. The tang is depressed with a screw driver or the like to disengage it from the upper crossarm. The connecting block is suspended by the anterior section of the pedestal from a panel located in front of the lower crossarm to expose the terminals on the rear surface. Conductors in cables to and from digital systems are then terminated on the rear terminals.

11 Claims, 65 Drawing Figures

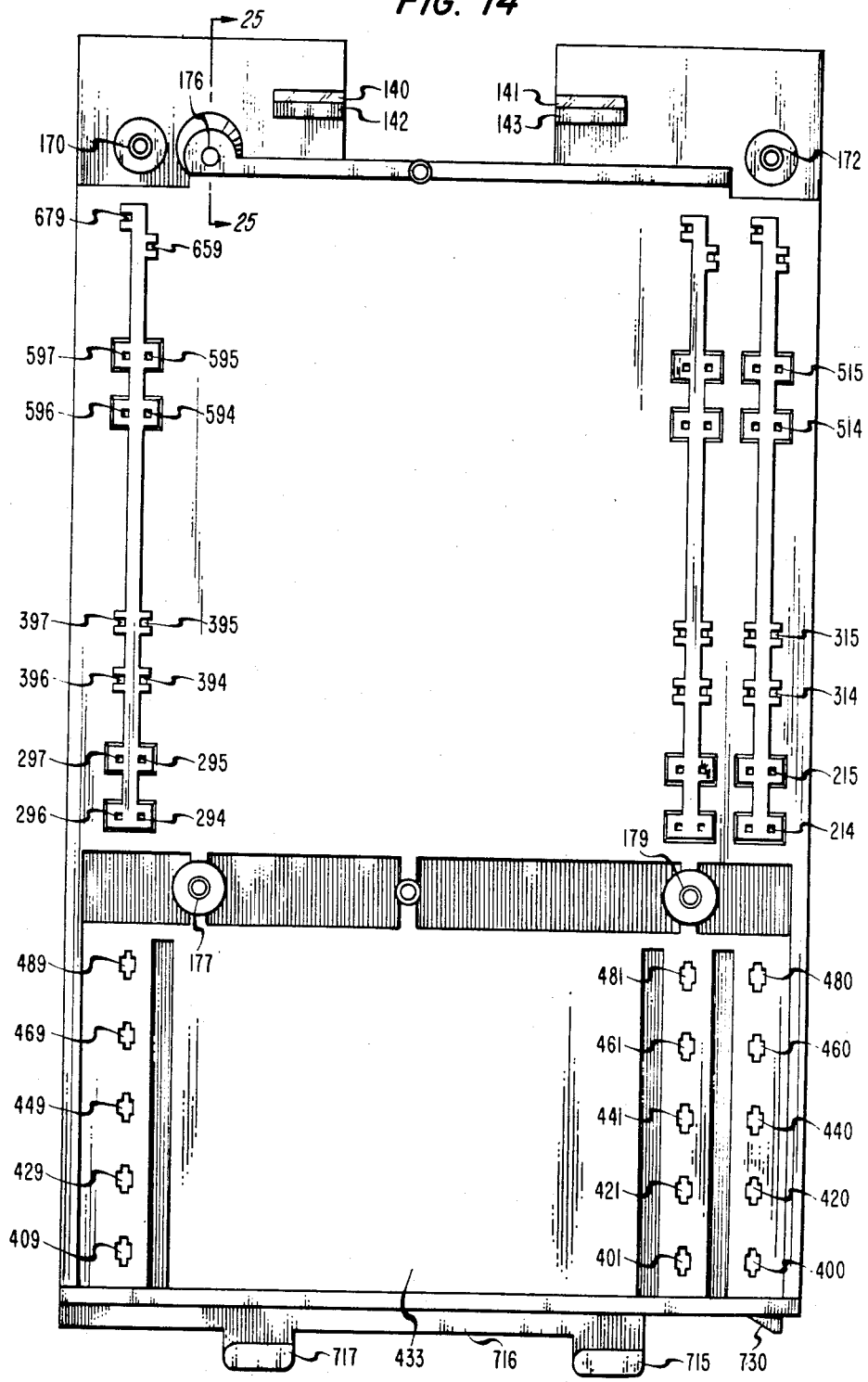

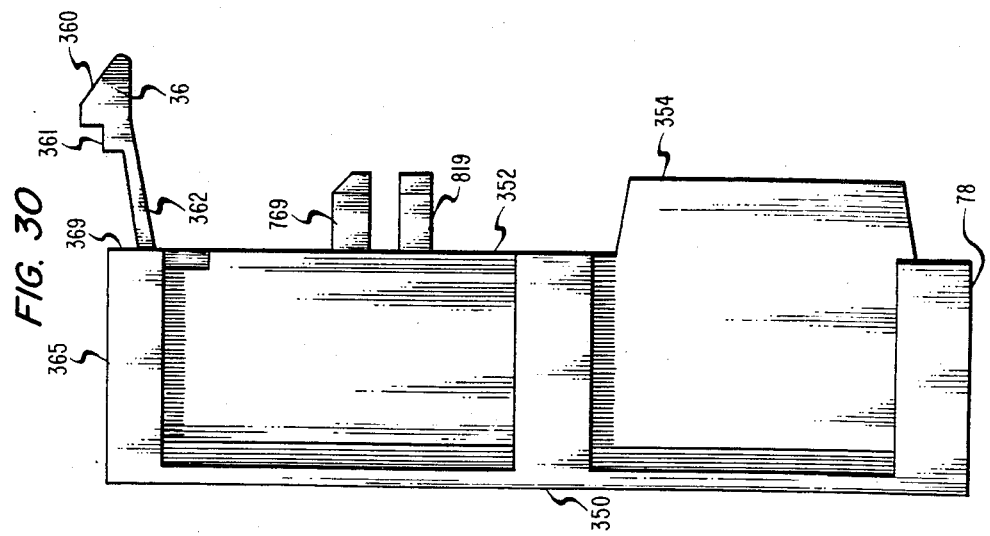
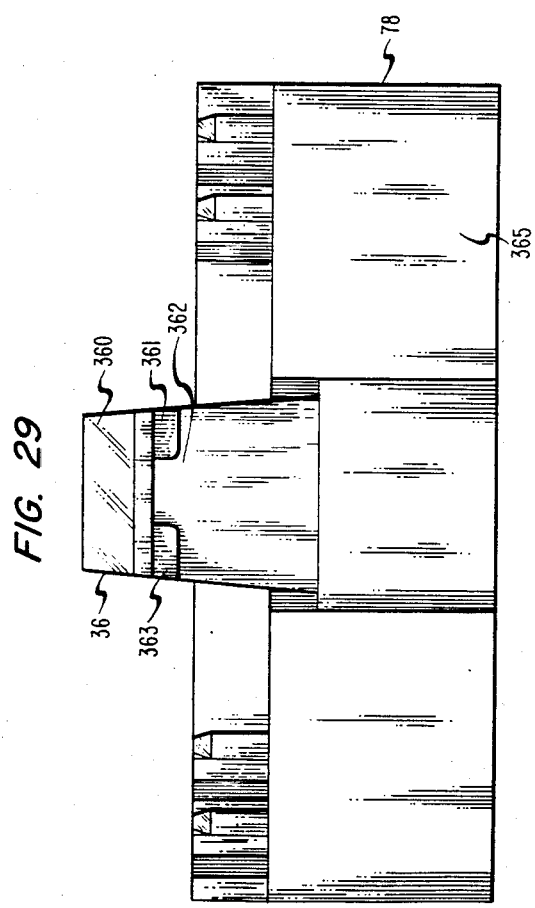

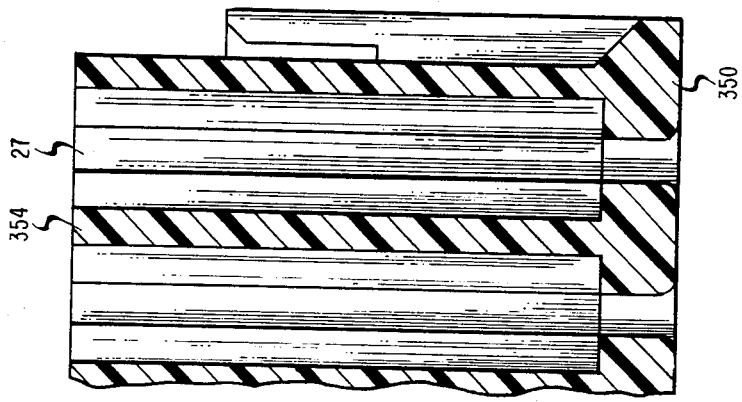
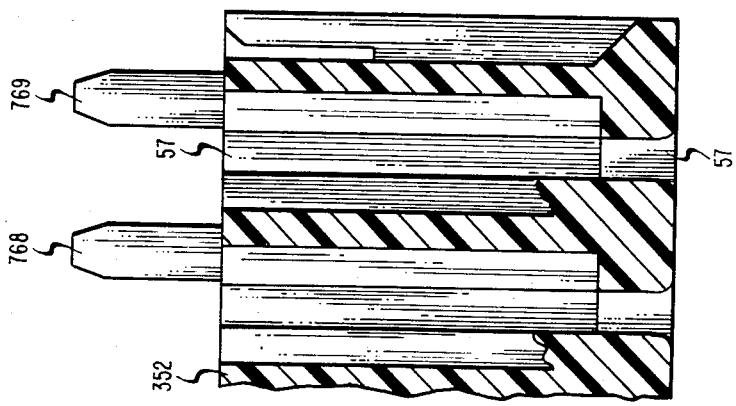

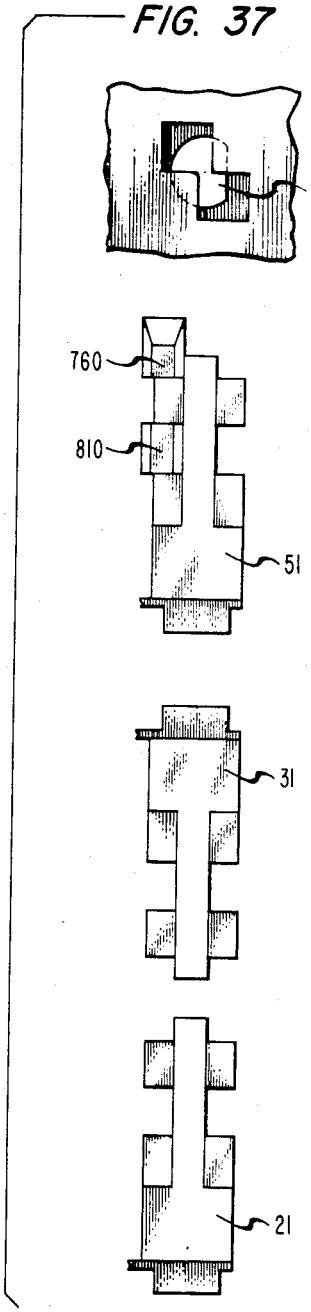

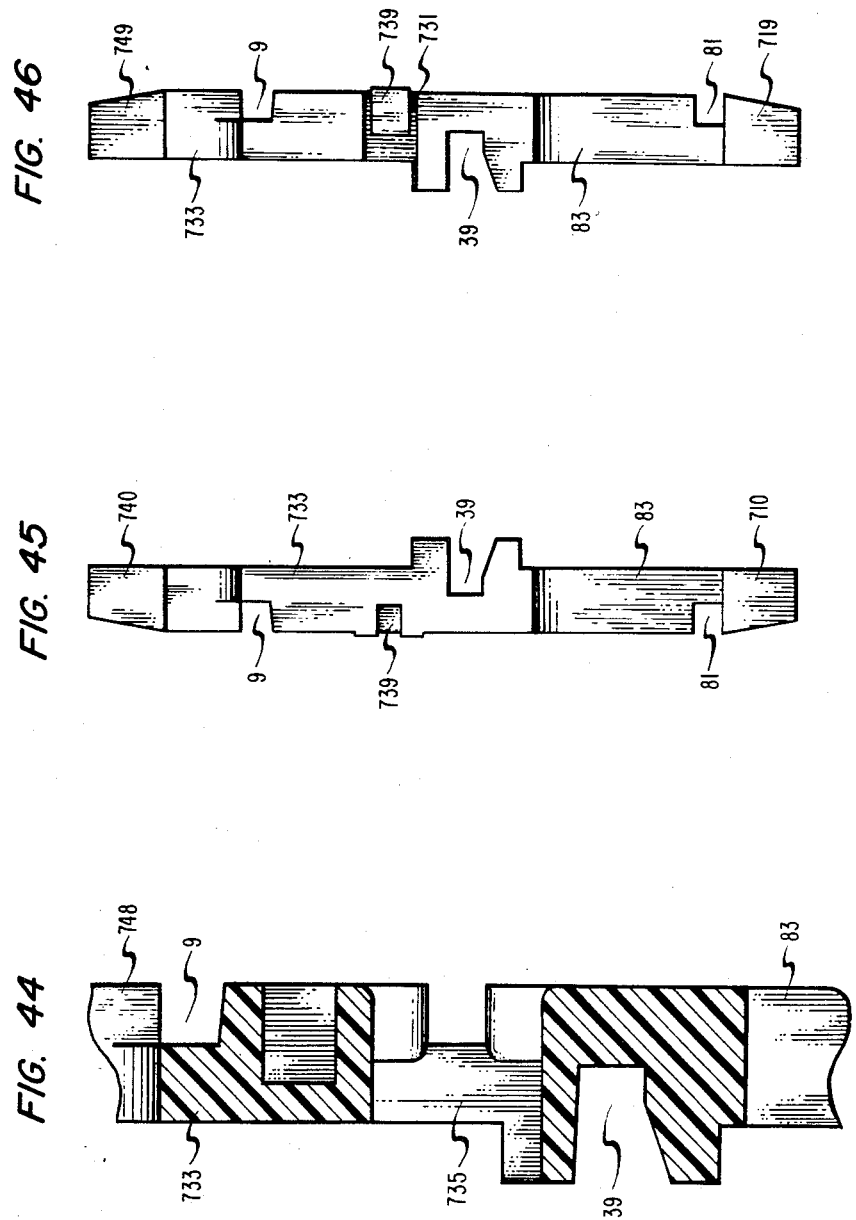

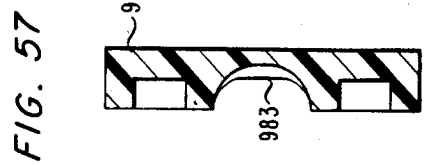
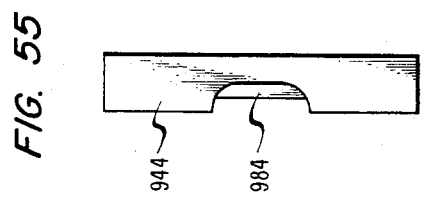
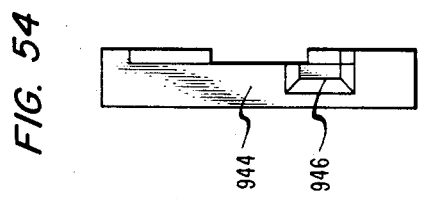
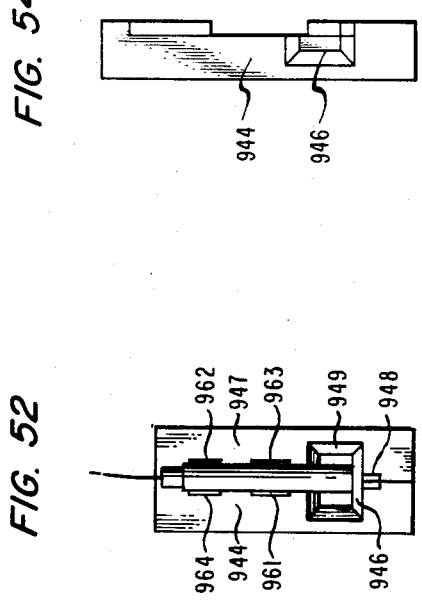
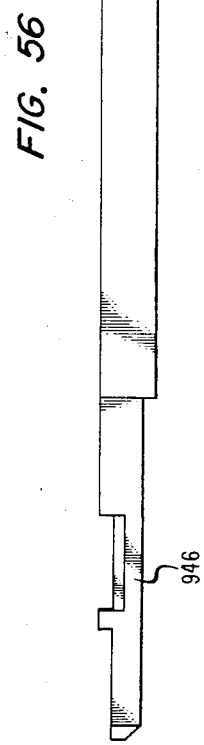

CONNECTING BLOCK FOR DIGITAL SYSTEM CROSS-CONNECT FRAME

TECHNICAL FIELD

This invention relates to cross connect frames and, in particular, to a connecting block for a digital system cross connect frame.

BACKGROUND OF THE INVENTION

A digital cross-connect system (DSX) provides a location for interconnecting two digital transmission paths. The apparatus for a DSX is located in one or more frames, or bays, usually in a telephone central office. The DSX apparatus also provides jack access to the transmission paths.

In prior art systems, a single panel of jacks spans the entire width of the bay. This limits the flexibility in working with the panel. The cables from the digital systems are routed to the rear of the DSX bays and to the sides of the terminating apparatus to permit access to terminating pins. This method of cable routing causes cable congestion at the DSX bays. In order to access the rear of the panel, a craftsperson would have to walk over to the aisle located at the rear of the bay housing the panel. Furthermore, only about fifty circuits per panel are available in prior art systems.

SUMMARY OF THE INVENTION

In accordance with the illustrative embodiment of this invention, there is disclosed an improved connecting block for use in a digital system cross connect frame to interconnect any two digital circuits. One of the novel aspects of this invention resides in the small size of the connecting block. The small size results from the use of printed wiring circuit boards to interconnect terminals on the rear of the connecting block with terminals on the front thereof and furthermore, from the incorporation of miniature planar jacks. Because of the printed wiring and the planar jacks, mass manufacturing methods are used to reduce the cost of terminating a circuit. Because of the smaller size, the space taken by a connecting block on the frame is reduced, thereby further reducing the cost of a circuit connecting two digital circuits by permitting a plurality of the connecting blocks to be installed in a horizontal shelf of the frame.

Another novel aspect of this invention resides in the geometry of the connecting block resulting in a flexible method of installation in and removal from the frame. A longitudinal groove in the bottom surface of a pedestal permits the block to be seated upon a lower crossarm of the frame. The upper surface of the block has a resilient tang which engages an upper crossarm when the connecting block is snapped into place. The block is removed by using a screwdriver, or the like, to depress the tang and disengage it from the upper crossarm.

Yet another novel aspect of this invention, resides in a longitudinal groove in the upper surface in the anterior section of the pedestal. This permits the connecting block to be suspended from a panel exposing the terminals on the rear surface of the connecting block. The now exposed rear terminals permit to be terminated thereon conductors in cables to and from digital systems. An advantage of this invention resides in the availability of the entire rear surface of the frame for locating cables, avoiding congestion of prior art systems.

BRIEF DESCRIPTION OF THE DRAWING

FIGS. 13 and 14 show, respectively, a side elevational view and a rear elevational view of the rear section of the housing for the connecting block;

FIGS. 28 through 31 show, respectively, the front section of the housing unit for the connecting block in front elevational view, the top plan view, a side elevational view, and a rear elevational view;

FIGS. 32 through 38 show views taken along different sections through the front section of the housing unit of the connecting block;

FIGS. 43 through 46 show views through different sections through the fanning strip of the connecting block;

FIG. 52 shows an end view of the plug of FIG. 48;

FIGS. 53 through 59 show different views of the shell of the plug of FIG. 48;

DETAILED DESCRIPTION

Figure 1:
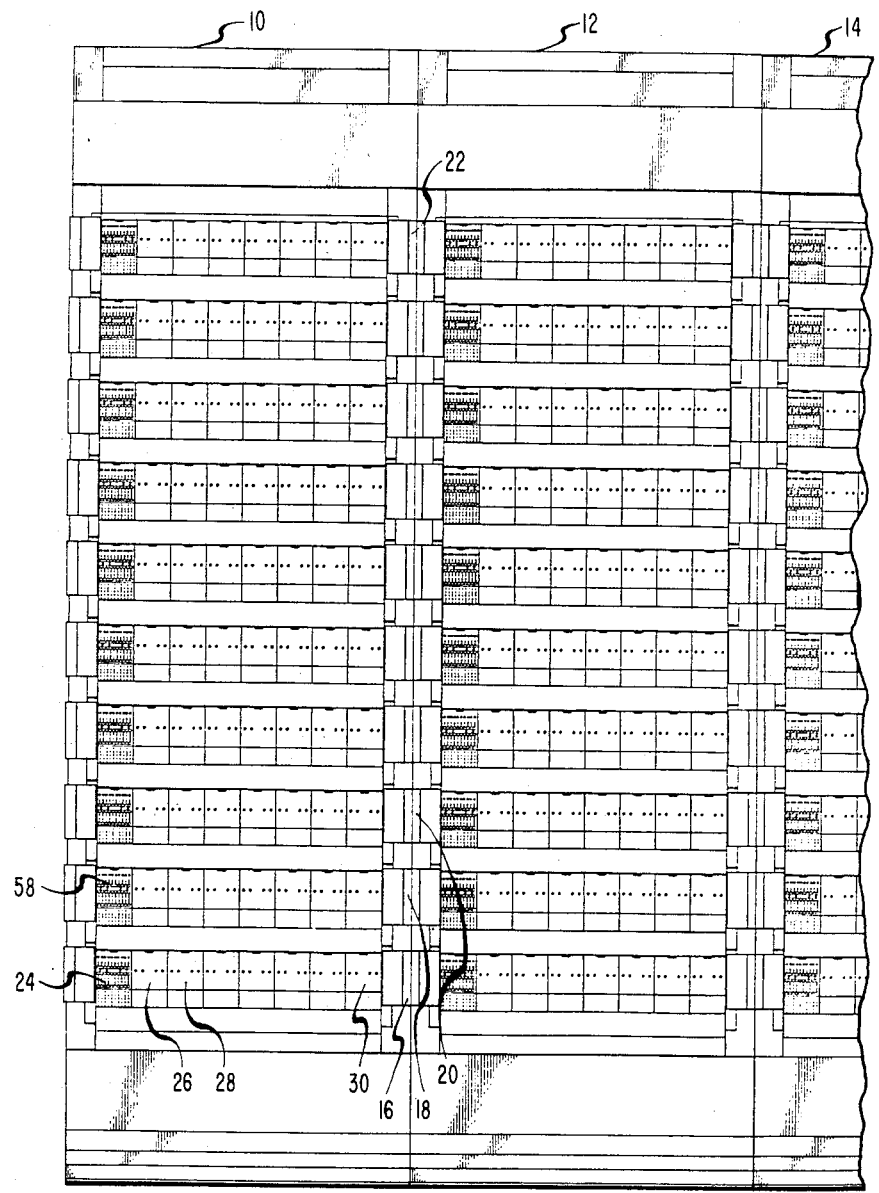
FIG. 1 shows the front of a plurality of digital system cross-connect (DSX) frames.

Referring to FIG. 1, there is shown a front view of a plurality of digital system cross-connect (DSX) frames, or bays, 10, 12 and 14. Referring more particularly to frame 10, shown there are a plurality of rows 16, 18, 20 . . . 22 of connecting blocks, ten in the preferred embodiment. Referring more particularly to row 16, which is representative of the remaining rows, there is shown a plurality of connecting blocks 24, 26, 28 . . . 30, eight in the preferred embodiment. Each connecting block is adapted to cross-connect a plurality of circuits between any two digital systems (not shown in FIG. 1). In the preferred embodiment, each connecting block is adapted to cross-connect ten circuits.

Figure 2:
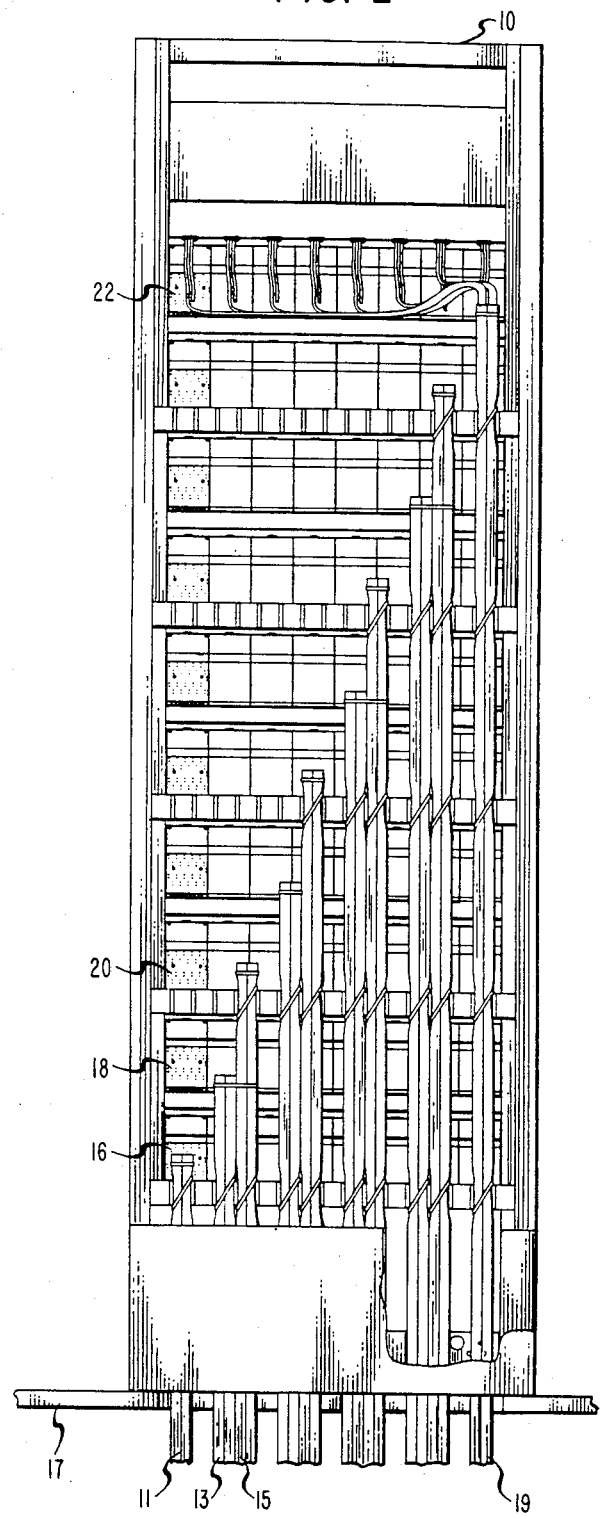
FIG. 2 shows the rear of a DSX frame.

Referring to FIG. 2, there is shown a rear view of DSX frame 10. Cables 11, 13, 15 . . . 19, each having a plurality of conductors, from and to digital systems are cascaded in an arrangement similar to a water fountain from floor 17 upwards and terminated, respectively, on to terminals of DSX units in rows 16, 18, 20 . . . 22. The cables could as well have been cascaded in an arrangement similar to a waterfall from a ceiling cable rack (not shown) downwards towards floor 17. In prior art digital cross-connect systems, cables are located at the sides of the frames, leading to cable congestion. A distinct advantage of the present invention resides in using the entire width to the rear of the frame for locating the cables.

Figure 3:
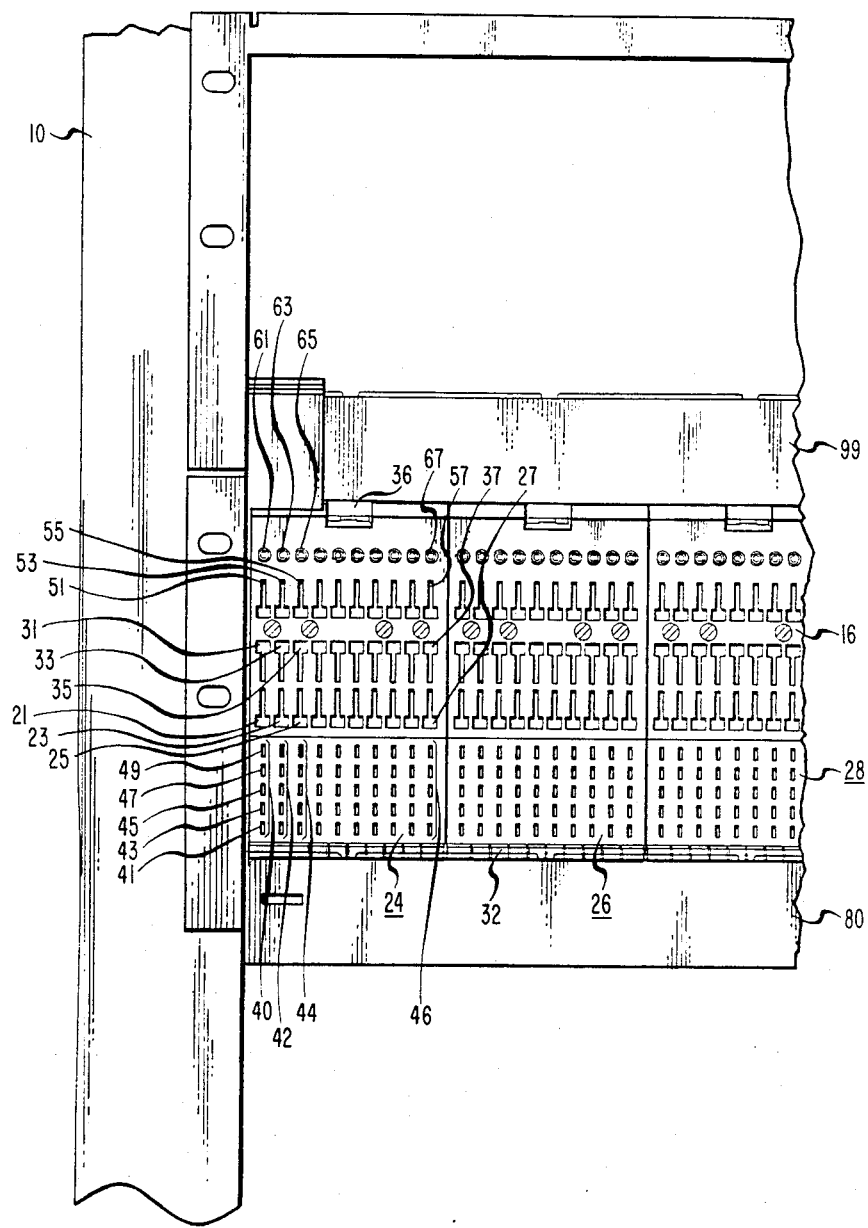
FIG. 3 shows a front view of a section of a row in a DSX frame.
Figure 4:
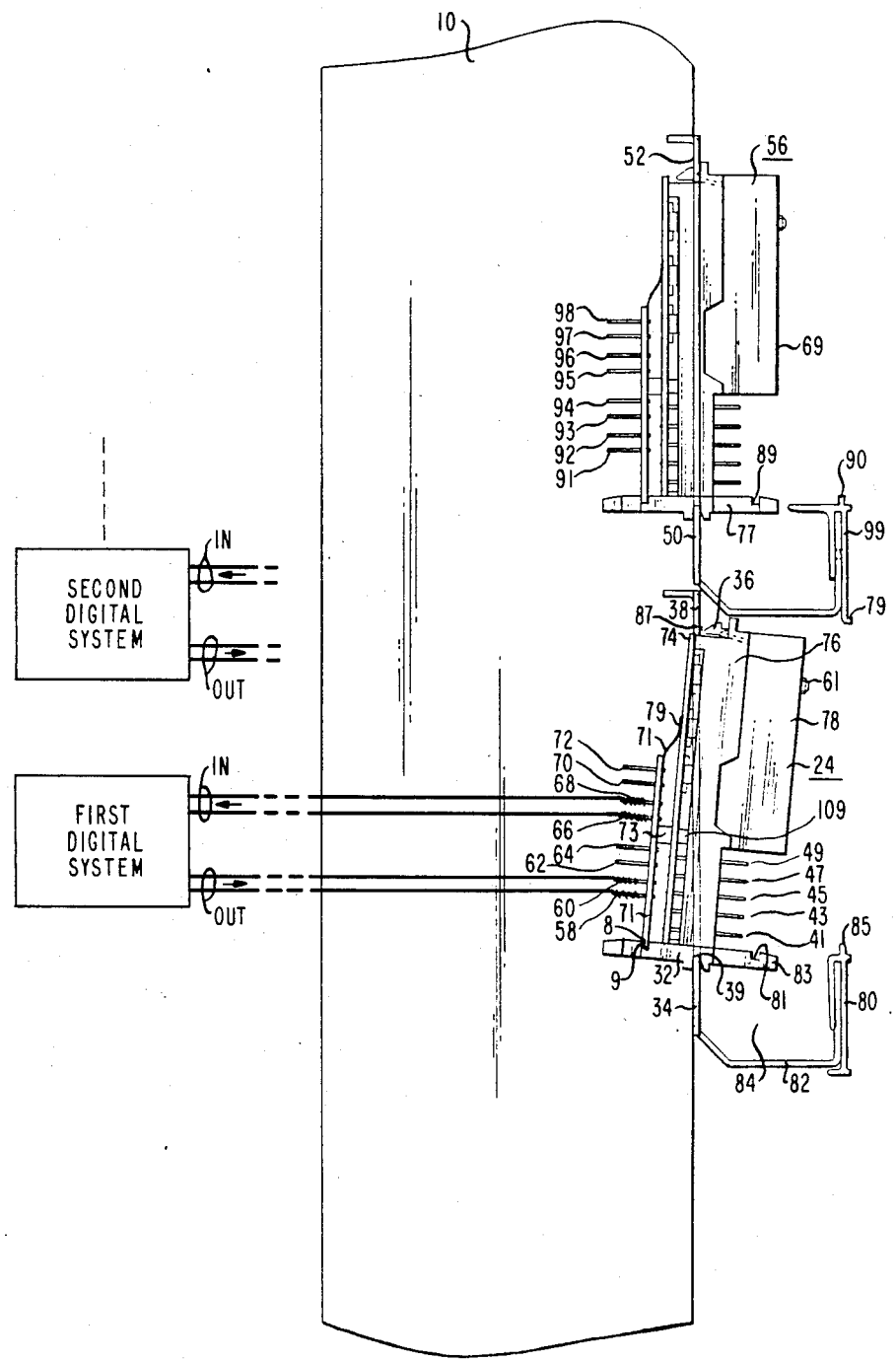
FIG. 4 shows an end view of two rows of a DSX frame.

Referring to FIG. 3, there is shown the front of connecting blocks 24, 26 and 28 of row 16. Referring briefly to FIG. 4, it can be seen that connecting block 24 is housed between two crossarms 34 and 38 of frame 10. Connecting block 24, which is illustrative of the remaining connecting blocks, has a pedestal 32 which is seated on the top of lower crossarm 34. The top of connecting block 24 has a resilient tang 36 which snaps into upper crossarm 38. Upper crossarm 38 and lower crossarm 34 together retain connecting block 24 in place.

Returning to FIG. 3, it can be seen that connecting block 24 has a plurality of sets of cross-connect terminals, or pins, 40, 42, 44 . . . 46, ten sets in the preferred embodiment which are used to connect two of the aforesaid digital systems. The lower two terminals, tip terminal 43 and ring terminal 41, of the set of terminals 40 which is representative of the other sets of terminals are called IN terminals. The next two terminals, tip terminal 47 and ring terminal 45, of set 40 are called the OUT terminals. The uppermost and fifth terminal 49 is called the tracing lamp (TL) terminal. The function of these terminals will be explained in more detail hereinbelow.

Connecting block 24 is shown having a row of IN jacks 21, 23, 25 . . . 27, a row of OUT jacks 31, 33, 35 . . . 37, a row of MON jacks 51, 53, 55 . . . 57, and a row of tracing lamps (TL) 61, 63, 65 . . . 67. In the preferred embodiment, there are ten in each row of IN, OUT and MON jacks. When a plug (shown in FIGS. 61 and 62) is inserted in a jack, say OUT jack 31, the normal path will be interrupted to include a circuit within a plug. This interruption is useful for two reasons: temporarily disabling the hard wired cross connection to permit flexible circuit rearrangements for maintenance or for routing adjustments.

Referring to FIG. 4, there is shown a side elevational view of frame 10 having connecting block 56 seated in place within crossarms 50 and 52. Connecting block 24 is shown partially in place. There is shown, to the rear of connecting block 24, a plurality of terminals 58, 60, 62 . . . 72 housed within a backplane 71. A plurality of finger-like terminations (not shown in FIG. 4) on an upper portion 79 which is contoured forward from the remainder of backplane 71 make contact with corresponding finger-like terminations on rigid wiring board 74. This will be shown more clearly with reference to FIGS. 7 through 10 hereinbelow. The remainder of flexible wiring board 71 is separated by a spacer 73, one of a plurality, from rigid wiring board 74. Conductors in cables to and from the aforesaid digital systems are hard wired to these terminals, as shown hereinbelow with reference to FIG. 5, by being wire wrapped thereon.

Terminals 58 and 60 are the OUT terminals and terminate the ring and tip conductors from a first one of the aforesaid digital systems (shown in FIG. 6) to the DSX connecting block 24. In the preferred embodiment, there are five such sets of terminals in the same row. There are also another row having five sets of OUT terminals 62, 64. Terminals 68 and 66 are the IN terminals and terminate the ring and the tip conductors from the DSX connecting block 24 to the first digital system. In the preferred embodiment, there are five such sets of IN terminals. There is also another set of IN terminals 72 and 70 in a different row. These two sets of terminals are staggered, like the IN terminals, to maximize the separation of wiring paths on flexible wiring board 71. The circuit paths will be explained in more detail with reference to FIG. 6 hereinbelow.

Front section 78 and rear section 76 together form a housing unit for the plurality of terminals 41 . . . 49 and a plurality of electrical contacts to be disclosed in greater detail with reference to FIG. 7 hereinbelow. Returning to FIG. 4, pedestal 32 of connecting block 24 is shown having in its lower surface a longitudinal slot 39 which sits upon an upper edge of lower crossarm 34. Lower crossarm 34 is substantially parallel to an upward rising panel 80 and is interconnected therewith by a horizontal base 82 to form a trough 84. Conductors (not shown in FIG. 4) which interconnect one set of terminals say 40 with another set, say 46 of FIG. 3, are placed in trough 84.

There is shown a resilient, cantilever-like tang 36 on front section 78 of the housing of connecting block 24. When connecting block 24 is urged toward frame 10, the lower surface 87 of crossarm 38 makes contact with the upper surface of tang 36 and urges it downwards until the end of the sloping upper surface thereof is reached and tang 36 springs upward to lock connecting block 24 in place.

Longitudinal slot 81 is shown within the upper surface of anterior projection 83 of pedestal 32. Longitudinal slot 81 is adapted to mate with rim 85 of upwardly rising panel 80 of crossarm 34 when connecting block 24 is snapped out of bay 10. When thus placed, connecting block 24 exposes terminals 58 through 72 on backplane 71 for terminating thereon conductors from the aforesaid digital systems. This frees the space behind frame 10 for locating cables. This space would otherwise be needed by a person to terminate conductors on terminals 58 through 72.

Figure 5:
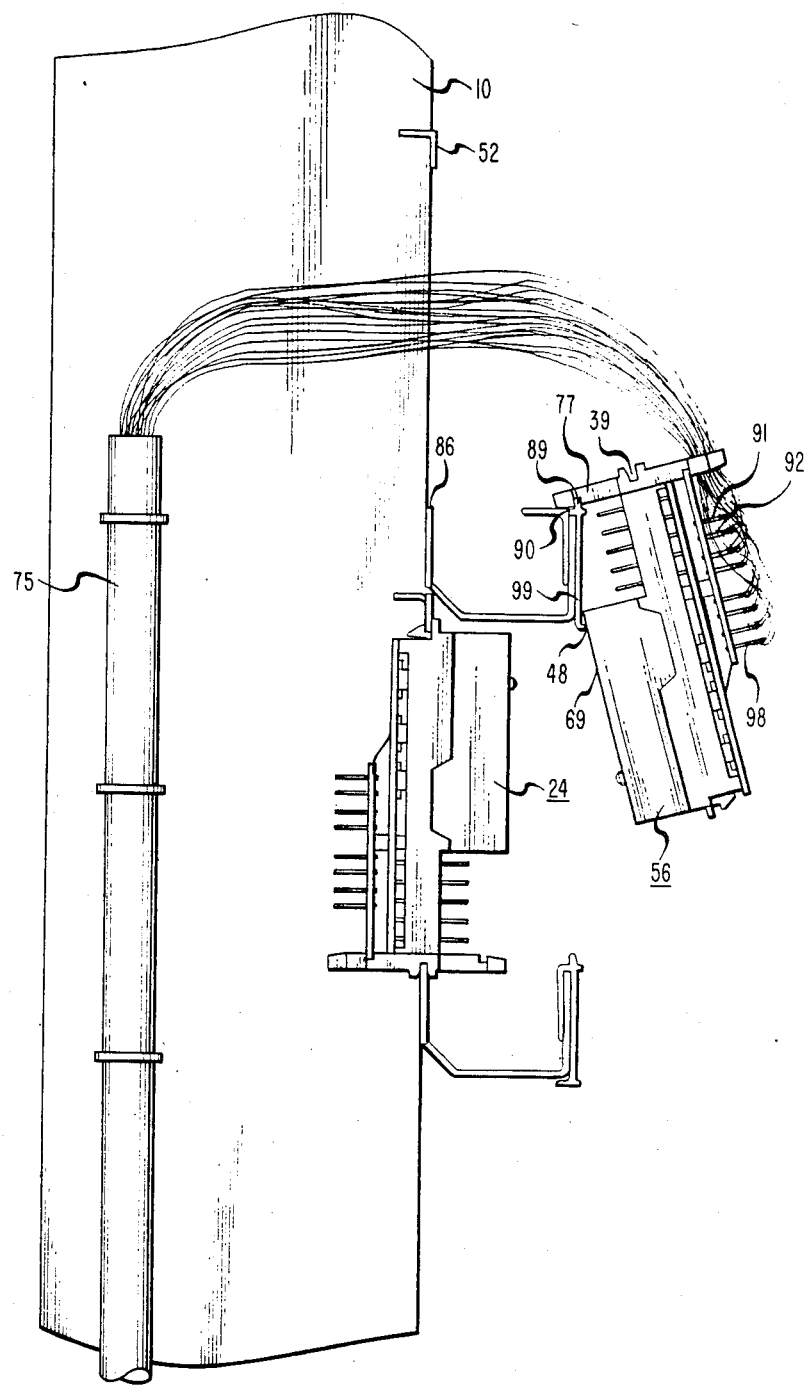
FIG. 5 shows an end view of a DSX frame with a connecting block in position for terminating on the rear terminals thereon circuits from digital systems.

Referring to FIG. 5, there is shown a connecting block 56 removed from its position between crossarms 50 and 52. Slot 89 on pedestal 77 of connecting block 56 is placed on upper edge 90 of uprising panel 99 so as to expose terminals 91 through 98 for termination thereon conductors from cable 75. The lower front surface 69 of connecting block 56 rests against a forward projecting element 79 of uprising panel 99 to present a good position for working on the aforesaid terminals 91 through 99.

Figure 6:
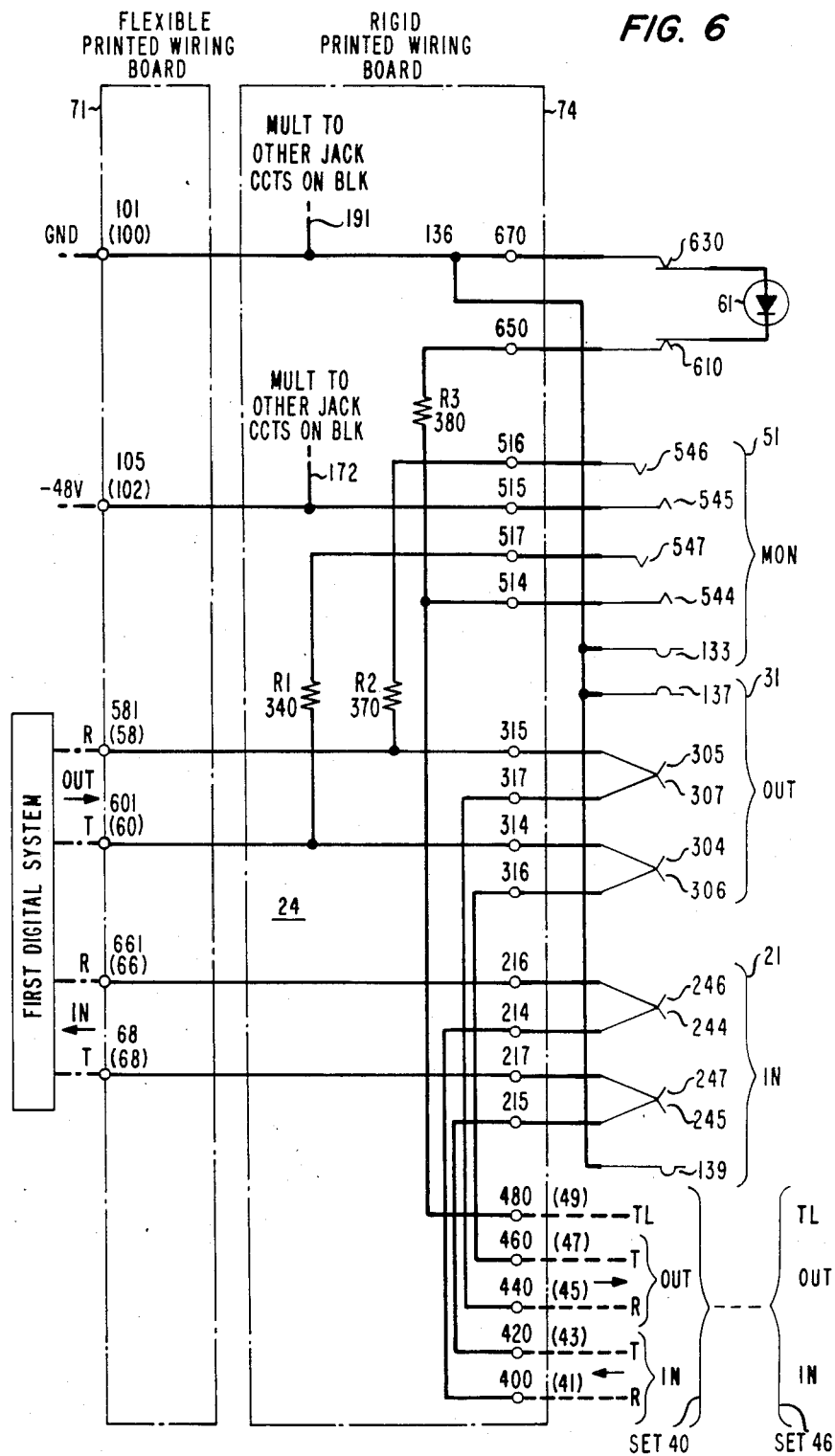
FIG. 6 shows an electrical wiring diagram for circuit paths through a DSX connecting block.

Referring to FIG. 6, there is shown a simplified wiring diagram for connecting block 24 which is typical of the other connecting blocks. A pair of tip and ring conductors from a first digital system is terminated on terminals 60 and 58 which are housed respectively in holes 601 and 581. These conductors which convey information from the digital system to connecting block 24 are the OUT terminals as stated hereinabove with reference to FIG. 4. Terminals 66 and 68, known as the IN terminals, which are housed respectively in holes 661 and 681, are connected to a pair of ring and tip conductors for conveying information from connecting block 24 to the first digital system. There is also provided a terminal 100 (not shown in FIGS. 4 or 5) which is housed in hole 101 and is connected to ground potential. A terminal 102 (also not shown in FIGS. 4 or 5) is housed in hole 105 and is connected to a voltage supply, —48 Volts in the preferred embodiment.

The aforesaid ground terminal 100 in hole 101 is connected through printed wiring on backplane 71 and through printed wiring on both surfaces of rigid board 74 to plated through hole 670 therein in which is located long electrical contact 630. Ground potential is made available to other similar terminals by way of bus 191.

The aforesaid voltage supply terminal 102 housed in hole 105 is connected via printed wiring on backplane 71 through printed wiring on both surfaces of rigid board 74 to a plated through hole 515 therein in which is located long electrical contact 545. The voltage supply is made available to other similar terminals via bus 172.

OUT terminal 58, used for terminating a ring conductor from a digital system, which is located in hole 581 is connected via printed wiring on backplane 71 and via printed wiring on rigid board 74 to plated through hole 315 in which is located short electrical contact 305. The ring hole 315 is connected also to plated through hole 516 in which is housed short electrical contact 546 via resistor 370.

Hole 601 which is used for housing OUT terminal 60 terminating a tip conductor from the aforesaid first digital system is connected via printed wiring on backplane 71 and printed wiring on rigid board 74 to plated through hole 314 which houses short electrical contact 304. Plated through hole 314 is connected also to plated through hole 517 which houses short electrical contact 547 via resistor 340.

Likewise, plated through holes 661 and 681 for IN terminals 66 and 68 are connected via printed wiring on backplane 71 and on rigid board 74 to plated through holes 216 and 217 respectively. Holes 216 and 217 house short electrical contacts 246 and 247 respectively.

Plated through holes 400, 420, 440, 460 and 480 house respectively terminals 41, 43, 45, 47 and 49 (shown in FIG. 4 hereinabove) which are located on the lower front surface of rear section 76 of the housing unit of connecting block 24. The set of terminals 41 . . . 49 is connected by way of jumper wires to a corresponding set of terminals (say 46 of FIG. 3). The TL terminal 49 of set 40 is connected with a corresponding TL terminal of set 46. The tip and ring OUT terminals 47 and 45 of set 40 are connected to the tip and ring IN terminals of set 46. The tip and ring IN terminals 43 and 41 of set 40 are connected to the tip and ring OUT terminals of set 46. By this manner, the aforesaid cross connection between two digital circuits is effected.

Plated through hole 480, used for tracing lamp (TL) 61 the function for which is to be explained hereinbelow, is connected via resistor 380 to plated through hole 650. Long electrical contact 610 is located in plated through hole 650. Plated through hole 480 is connected directly also to plated through hole 514. Long electrical contact 544 is located in plated through hole 514.

Plated through holes 460 and 440 house the tip and ring OUT terminals. These holes 460 and 440 are connected respectively to plated through holes 316 and 317. Holes 316 and 317 house short electrical contacts 306 and 307 respectively. Electrical contact 304 and the aforesaid electrical contact 306 are in contact with each other in the normal position. Thus, the tip path from the aforesaid digital system is established from terminal 60 in hole 601 in backplane 71 to hole 314 and electrical contact 304, of OUT jack 31 in FIG. 3, and to hole 460 in which is housed terminal 47.

Likewise, in the normal position electrical contacts 305 and 307 are in direct contact with each other. The ring path from the aforesaid digital system is established from terminal 58 in hole 581 in backplane 71 to hole 315 and short electrical contact 305, to short electrical contact 307 in hole 317 of OUT jack 31, in FIG. 3, and then to terminal 45 in hole 440.

Figure 48:
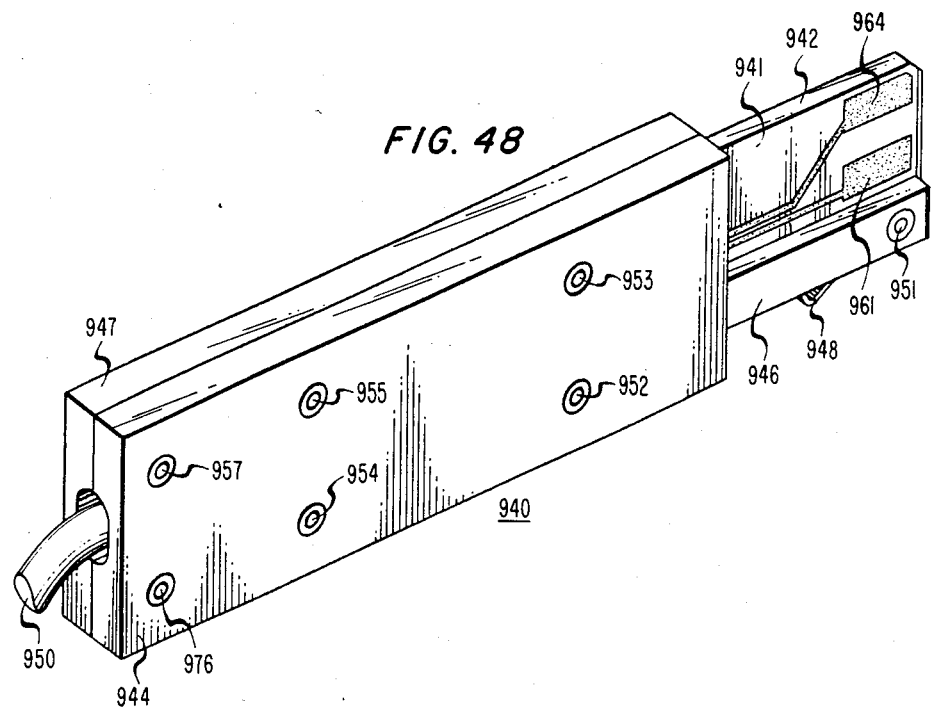
FIG. 48 shows a plug in isometric view for use with the connecting block.
Figure 61:
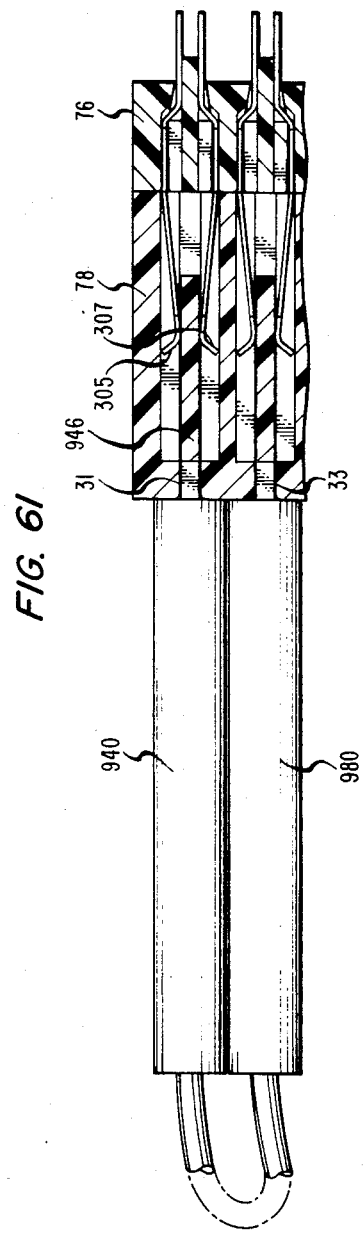
FIG. 61 shows a cross section of a plan view of a jack of FIG. 60 with a plug inserted therein.
Figure 62:
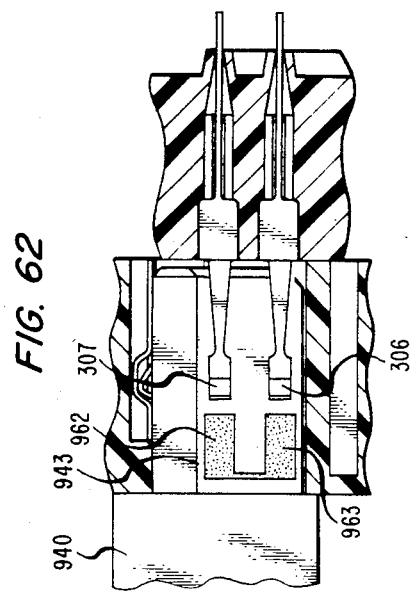
FIG. 62 shows an elevational view of FIG. 61.

When a plug, to be described hereinbelow with reference to FIG. 48, is inserted into OUT jack 31, as shown in FIGS. 61 and 62, continuity of circuit path between the pairs of electrical contacts 305, 307 and 304, 306 is broken to insert a circuit within the plug. By this method, the OUT circuit path may be tested. In emergencies, plugs are used to patch a path from the OUT jack of one circuit to the IN path of another.

Likewise, the ring and tip paths of IN terminals 66 and 68 are multipled respectively to IN terminals 41 and 43 because of the direct contact between the pairs of electrical contacts 244, 246 and 245, 247. This normal electrical path is broken when a plug is inserted into IN jack 21 either to test the IN path or to patch a path in an emergency.

Tracing lamp (TL) 61, a light emitting diode in the preferred embodiment, has two long arms which are inserted between electrical contacts 610 and 630. These electrical contacts are housed within holes 650 and 670 respectively.

Figure 64:
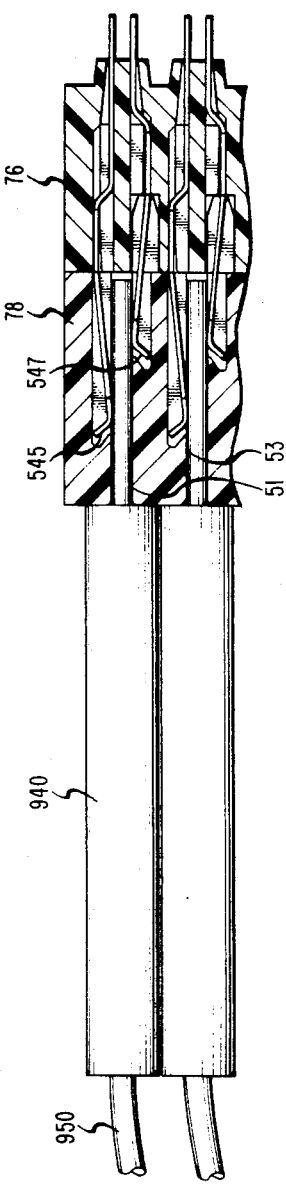
FIG. 64 shows a cross section of a plan view of a jack of FIG. 63 with a plug inserted therein.
Figure 65:
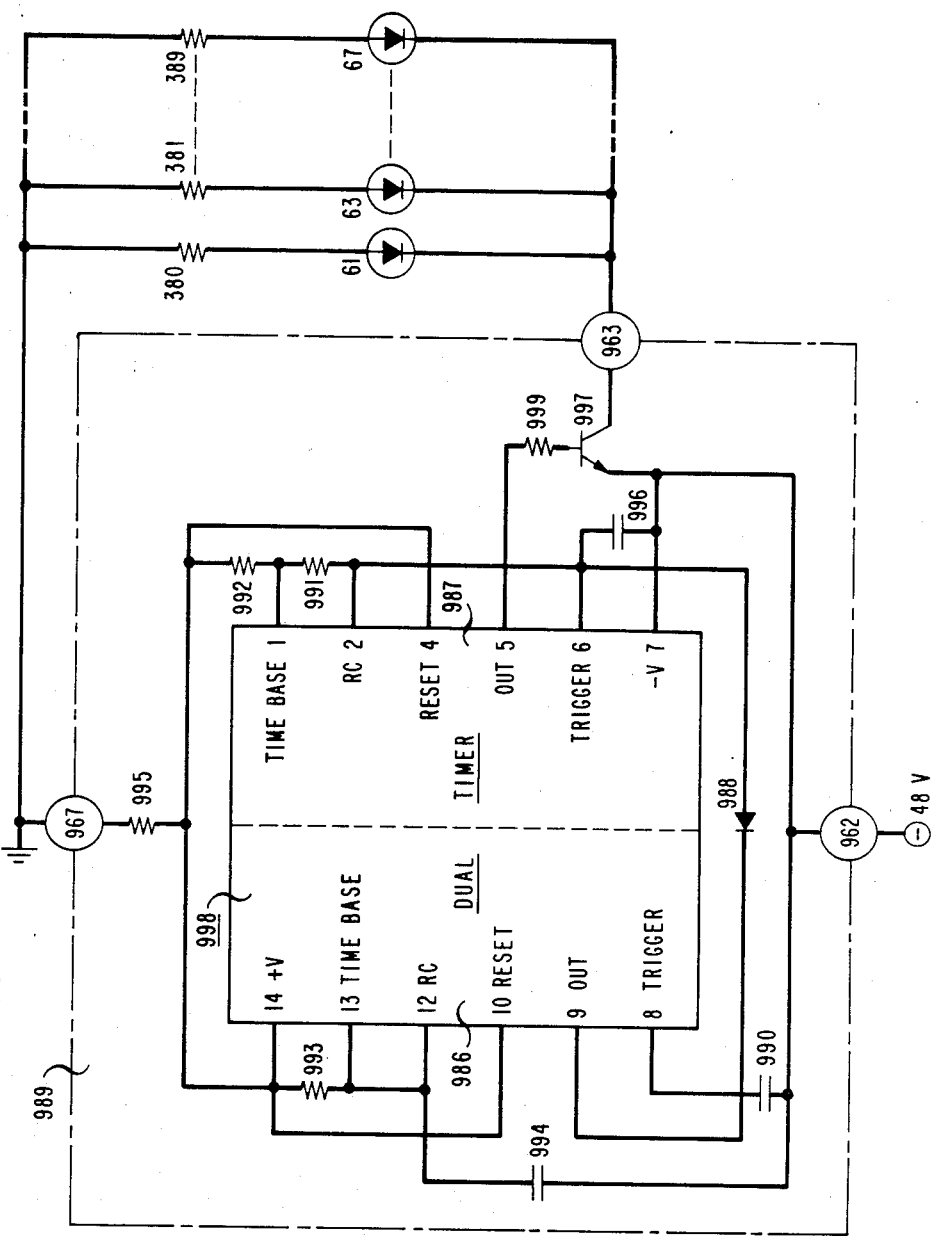
FIG. 65 shows a circuit for causing a tracing lamp associated with a jack to flicker for a predetermined period.

A plug is inserted into MON jack 51, in a similar manner, to test the circuit. Electrical contacts 544, 545, 546 and 547 are housed in holes 514, 515, 516 and 517 respectively. It is noted, however, that contacts 545 and 544 are longer than contacts 544 and 546. When a plug is inserted into MON jack 51 as shown in FIG. 64 hereinbelow, to test the circuit, current from voltage supply bus 172 flows through contact 545, the plug circuit as shown in FIG. 65 hereinbelow, contact 544, through resistor 380 through tracing lamp 61, and to ground potential, thereby causing lamp 61 to illuminate.

Shorter electrical contacts 546 and 547 are connected to the ring and tip conductors of OUT path via resistors 370 and 340 so that excessive currents are not drawn and avoiding thereby distortion of the information in the OUT path while the OUT path is being monitored.

Figure 7:
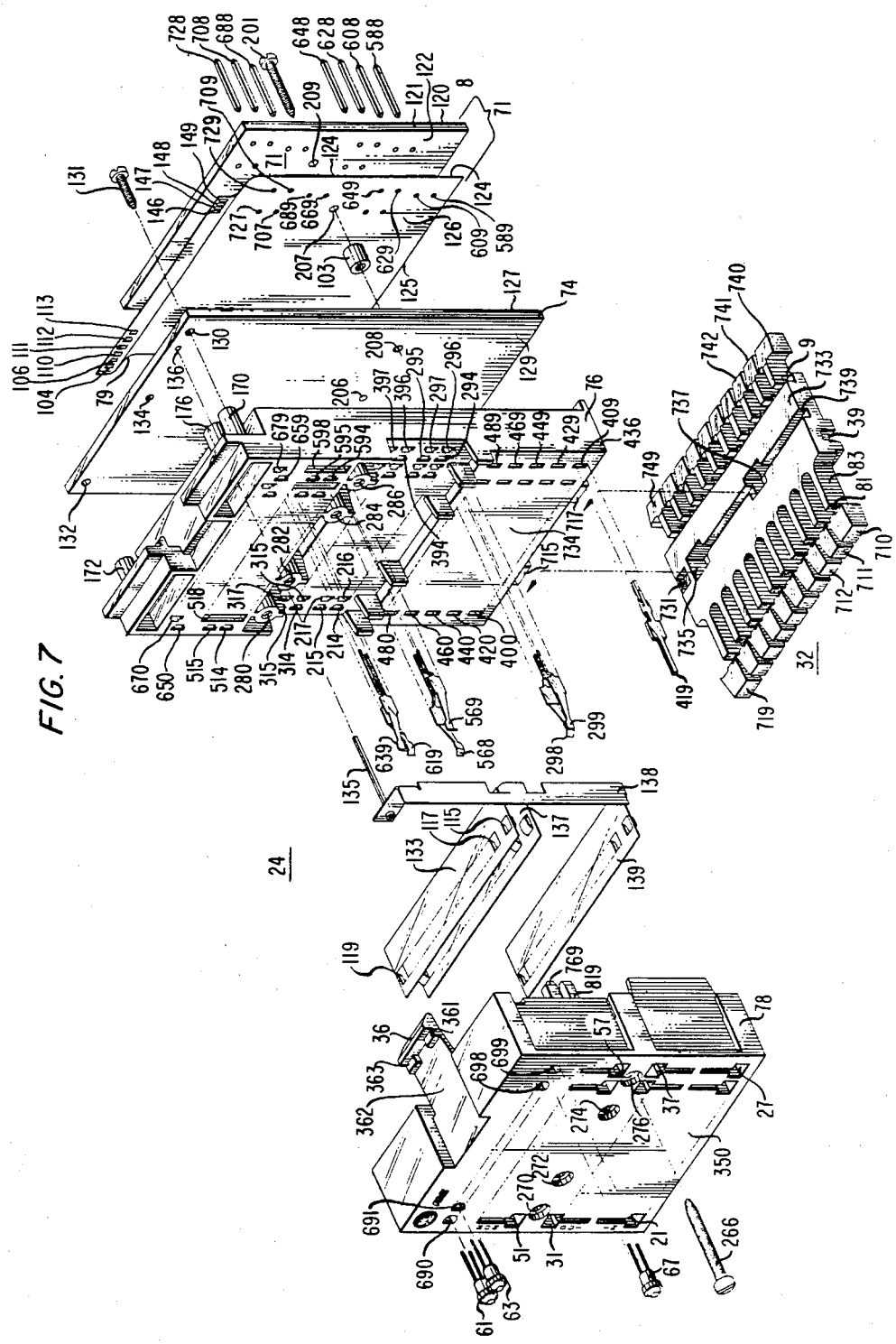
FIG. 7 shows in isometric view an exploded connecting block.
Figure 47:
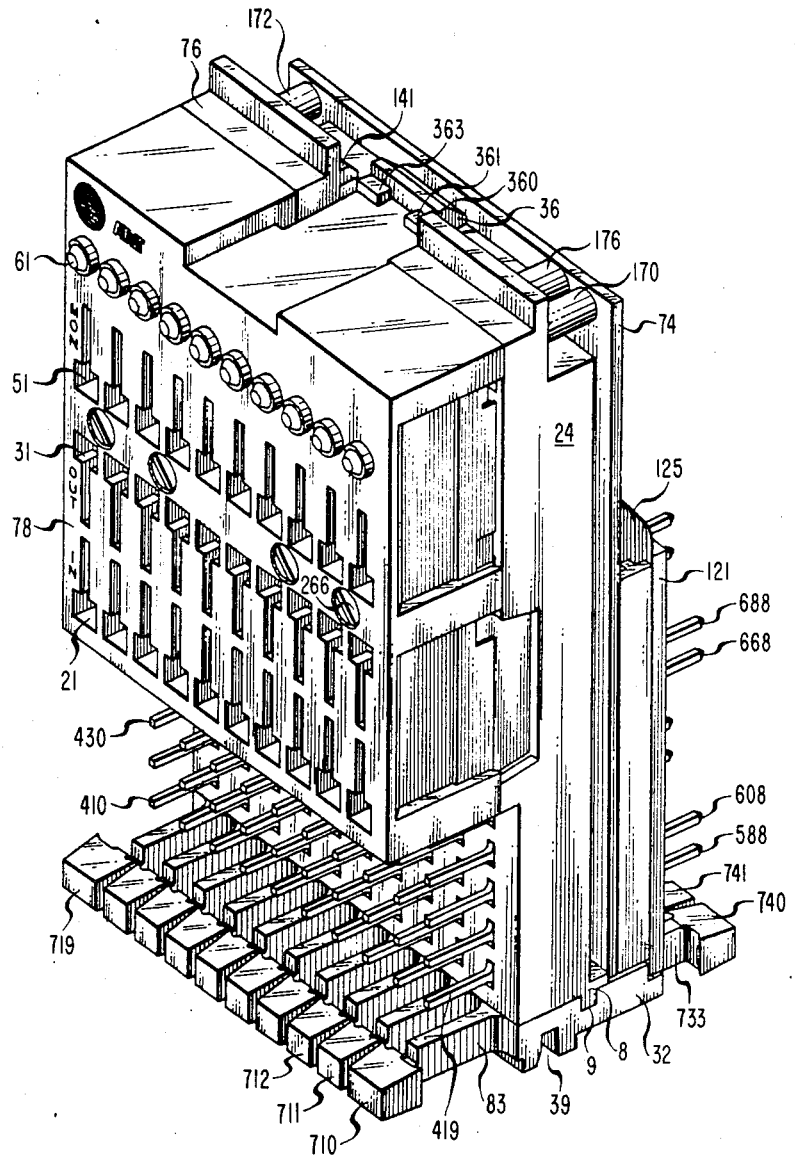
FIG. 47 shows an isometric view of the assembled connecting block.

Referring to FIG. 7, there is shown an isometric, exploded view of connecting block 24. An isometric view of a completely assembled connecting block 24 is shown in FIG. 47 hereinbelow. Backplane 71, of FIG. 4, is shown comprising a plurality of terminals 588, 608, 628, board 125 and board 121. Surface 124 of flexible wiring board 125 is bonded to surface 122 of rigid board 121. Rigid board 121 provides support for flexible board 125 and for the terminals 588, 608 . . . 728.

Terminals 588 and 608 fit within holes 589 and 609, respectively, representing the ring and tip OUT terminals for one circuit. Holes 629 and 649 house, respectively, OUT ring and tip terminals 628 and 648 for another circuit. These two sets of holes 589, 609 and 629, 649 are staggered to maximize separation of wiring paths on flexible wiring board 125. The corresponding IN terminals 668 (not shown in FIG. 7), 688 and 708, 728 are housed in holes 669, 689 and 709, 729. As stated hereinabove, digital system circuits are terminated on the aforesaid terminals 588 . . . 728. In the preferred embodiment, ten sets of IN and OUT terminals are provided for ten circuits.

The bottom edge 8 of backplane 71 fits within slot 9 of pedestal 32, as shown earlier in FIG. 4. Referring to 7, there is shown a plurality of fingers 104, 106, 110 . . . 149 for terminating the wiring paths from the aforesaid terminals 588 . . . 728. Details of the wiring diagram on surface 126 of wiring board 125 will be disclosed in FIG. 8 hereinbelow.

There is shown a rigid wiring board 74 having a wiring surface 127 and a component surface 129. Surface 127, which will be disclosed in detail hereinbelow with reference to FIG. 9, has a plurality of fingers (not shown in FIG. 7) which mate with the fingers on surface 126 of flexible wiring board 125. Component surface 129 of rigid board 74 which is disclosed hereinbelow with reference to FIG. 10 communicates with the wiring on surface 127 through a plurality of plated through holes also shown in the detailed drawings hereinbelow.

Rigid board 74 is fastened mechanically to rear section 76 of the housing unit, details of which are shown hereinbelow in FIGS. 11 through 27, by a plurality of screws one of which is shown as element 131. An alignment hole 134 positions rigid board 74 on rear section 76 which has an element 174 projecting therefrom and shown more clearly in FIGS. 12 and 13 hereinbelow. Hole 136 on component surface 129 of rigid board 74 receives grounding pin 135 which is part of grounding bar 138. Hole 136 which is plated through as stated hereinabove provides a path by printed wiring for grounding pin 135 to a ground bus on surface 127 of rigid board 74 then through a finger corresponding with finger 104 on surface 126 of flexible wiring board 125 through printed wiring thereon to a terminal (not shown in FIG. 7) to ground potential.

A plurality of sets of terminals, one terminal is element 419, are lodged within corresponding sets of recesses, one set being shown as 409 . . . 489 through rear section 76. Recesses 409 and 429 house the ring and tip IN terminals respectively. Recesses 449 and 469 house the ring and tip OUT terminals respectively. Recess 489 houses the tracing lamp (TL) terminal. Jumper wires connect the terminals of one set with the corresponding terminals of another set. Each terminal projects through one of the aforesaid recesses through rear section 76 and through a corresponding plated through hole through rigid board 74. Each terminal is retained within a recess and the corresponding hole by means of a snap lock fit.

After rigid board 74 and housing rear section 76 have been assembled, backplane 71 is secured to this assembly by using a plurality of screws, one of which is shown as 201. Surface 126 of flexible board 125 is separated from surface 127 of rigid board 74 by means of a plurality of spacers, one of which is shown as element 103. Other types of spacers to effect the same function may also be used.

A plurality of short electrical contacts, two of which are shown in FIG. 7 as elements 298 and 299, are captivated within recesses of the housing rear 76 by the housing front 78. Recesses 294 and 296 house contacts 298 and 299 respectively. Contact 298 makes contact through rigid wiring board 74 with terminal 419 in recess 409, representing the ring side of the IN path. Contact 299 and recess 296 make contact with the ring side of IN path to the digital system through rigid board 74 and backplane 71. In the normal position, contacts 298 and 299 are in direct contact with each other providing a direct ring path between two digital systems for communication from one to the other. Recesses 295 and 297 house the IN, tip electrical contacts for communication between two digital systems for transmission from one to the other.

Likewise, recesses 394, 396 and 395, 397 house the ring and tip OUT terminals (not shown in FIG. 7), representing the path from one digital system through backplane 71, through rigid board 74, through housing rear section 76 and then through jumper wires to an IN path to another digital system.

Referring to FIG. 7, there is shown a long electrical contact 568 which is captivated within recess 594 of housing rear section 76 by housing front 78. Contact 568 is connected by printed wiring on component surface 129 of rigid board 74 to a terminal housed within recess 489 of housing rear section 76. Likewise, another long electrical contact is housed within recess 595 immediately above recess 594 in housing rear section 76. This terminal makes contact with a supply of −48 volts by means of wiring through rigid board 74 and backplane 71.

Immediately adjacent to recesses 594 and 595 are two recesses 596 and 597 which house two short electrical contacts, one of which is shown as element 569. These two electrical contacts make contact with recesses 395 and 394, respectively, representing the ring and tip OUT path. (FIG. 6 is useful in following the path.)

In the normal position, contact 568 and 569 will not touch each other. Only when a plug is inserted to test a circuit path, as will be disclosed hereinbelow, will current be permitted to flow through a test circuit in the plug as shown in FIG. 65 hereinbelow.

Referring to FIG. 7, there is shown a pair of long electrical contacts 619 and 639 which are captivated within recesses 679 and 659 by housing front 78. There are ten such sets of terminals in the preferred embodiment.

Ground bar 138 has three horizontal members 133, 137 and 139. Horizontal member 133, as do the other members 137 and 139, has a plurality of recesses 115, 117 . . . 119 for receiving a detent on a plug used for testing a circuit and to keep the plug from becoming disengaged during a test. Each horizontal member provides also a path to ground for the circuit being tested through ground bar 138 as stated hereinabove. Ground bar 138 is lodged within front surface 434 of rear section 76. Front section 78 of the housing unit is then placed over the upper portion of rear surface 350 of front section 78, thereby retaining ground bar 138 in place.

Front section 78 is secured to rear section 76 by means of a plurality of screws, one of which is shown as 266. Details of housing front section 78 are shown in FIGS. 28 through 38. A plurality of LED's 61, 63 . . . 67 are shown. LED 67, having two long arms projecting therefrom, is inserted through recess 699 in housing front section 78 to make contact with contacts 619 and 639.

Housing front section 78 has a plurality of sets, 21 . . . 27, 31 . . . 37 and 51 . . . 57 of openings for insertion of a test plug to make contact with the corresponding sets of electrical contacts housed within housing rear section 76. An opening, for example 27, provides an access to a jack comprising electrical contacts within recesses 294, 295, 296, 297 and to a detent within horizontal member 137.

Thereafter, pedestal 32 is assembled by permitting elements 715 and 717 projecting from the lower surface of housing rear section 76 to penetrate holes 735 and 737, respectively, through pedestal 32 and by sliding pedestal 32 in the direction from side 436 of rear section 76 to side 432 thereof. Further details of pedestal 32 and the manner in which it is retained on housing rear section 76 is disclosed in detail in FIGS. 39 through 46.

Figure 8:
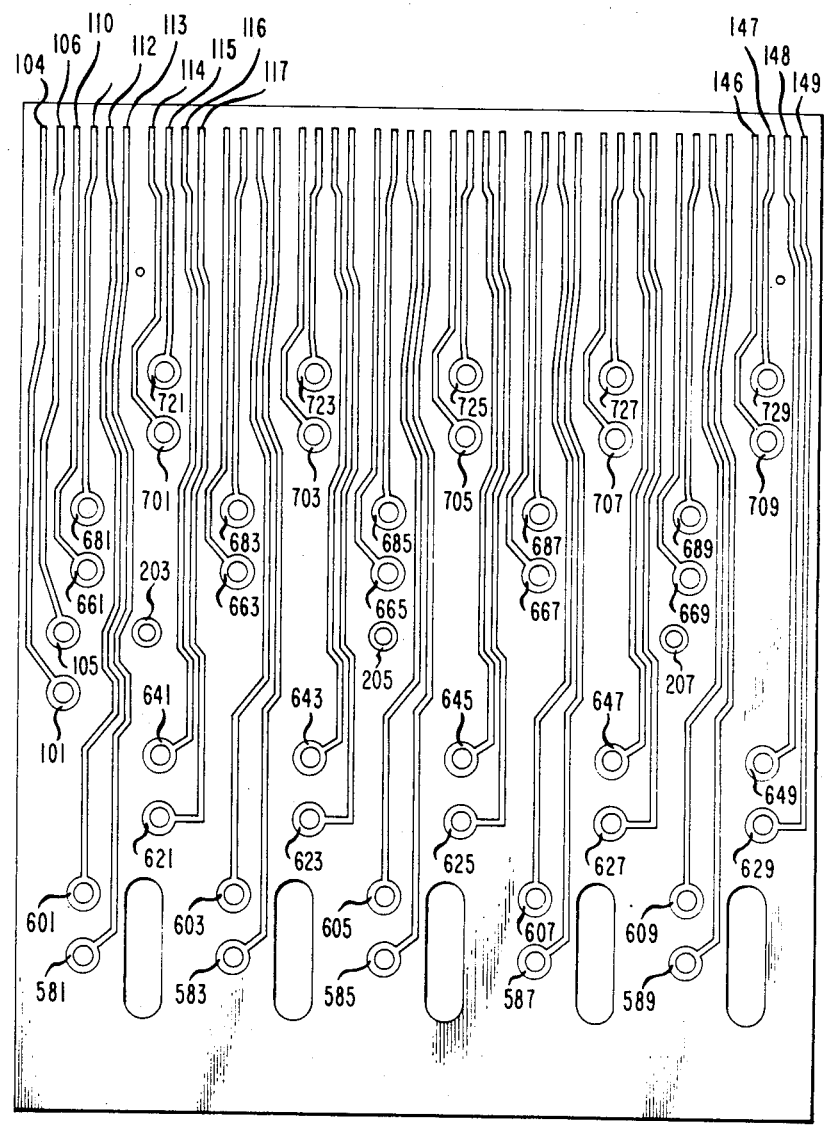
FIG. 8 shows a front elevational view of a flexible printed wiring board forming part of the backplane of the connecting block.

Referring to FIG. 8, there is shown flexible printed wiring board 125 of backplane 71. This flexible printed wiring board is bonded to a rigid board 121 as shown in FIG. 7 for structural support. There is shown a hole 101 for receiving a terminal which is inserted therethrough and retained therein by an interference fit. This terminal is connected to a ground potential (not shown) by known techniques.

A printed wire connects the terminal in hole 101 with finger 104. Likewise, a printed wire connects a terminal, providing a source of −48 Volts, through hole 105 with finger 106.

The remaining holes are seen to be organized in a staggered manner. Holes 581, 601 and 661, 681 correspond to the ring and tip of the OUT path from a digital system to backplane 71 and to the IN path from backplane 71 to the digital system. These holes are terminated in fingers 110 . . . 113. In the preferred embodiment, there are ten sets of terminals and holes, corresponding to ten circuits.

Figure 9:
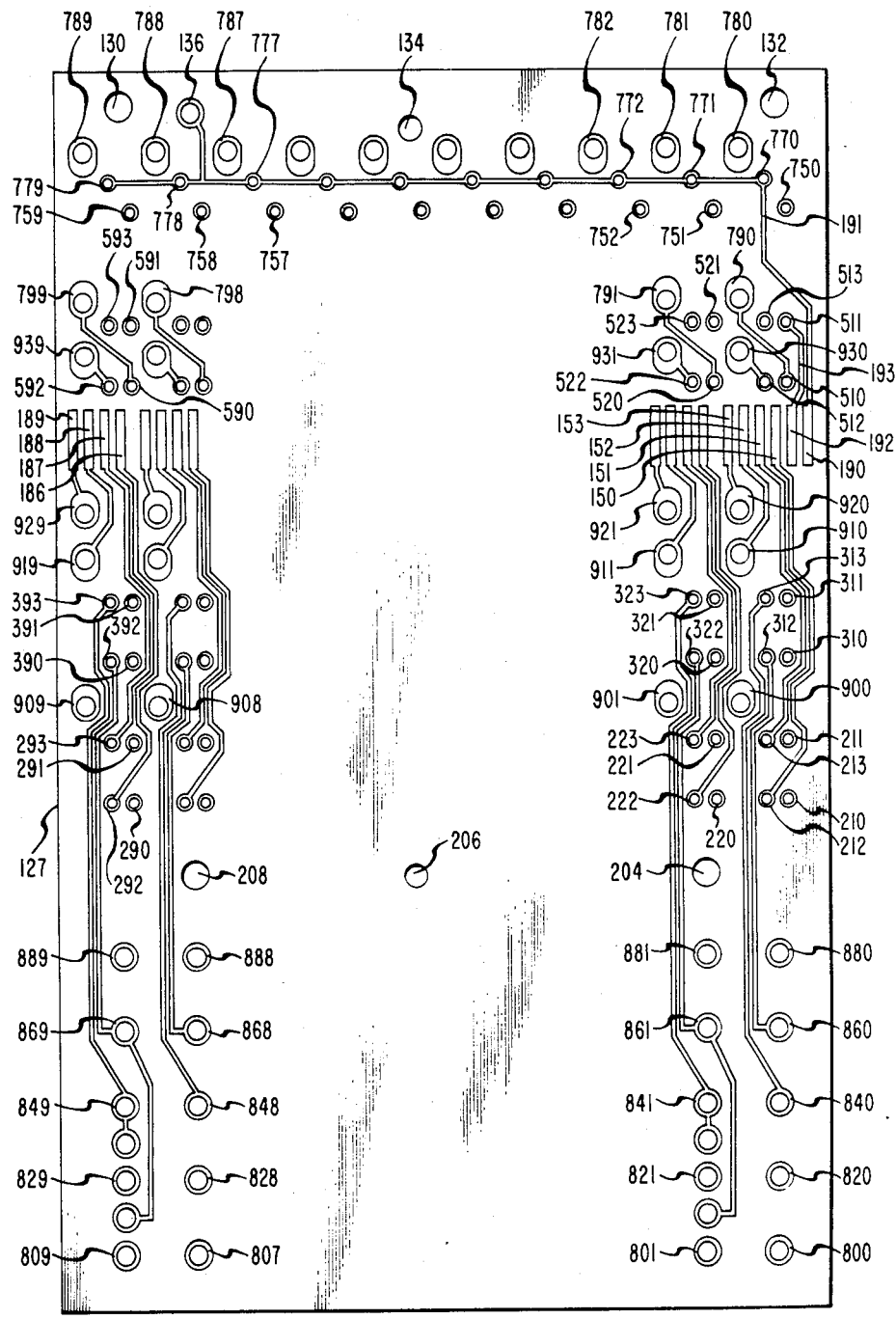
FIGS. 9 and 10 show front and rear elevational views, respectively, of a rigid wiring board for the connecting block.

Referring to FIG. 9, there is shown surface 127 of rigid board 74 of FIG. 7. Except for alignment holes 134 and 206, and holes 130 and 132 which are used to secure rigid board 74 to housing rear section 76 and holes 204 and 208 which are used to secure backplane 71 to rigid board 74, the remaining holes through rigid board 74 are plated through with a material which facilitates electrical conduction.

Hole 136 receives grounding pin 135 from ground bar 138 of FIG. 7 and is connected to ground bus 191 which in turn is connected to finger 190. Finger 190 communicates with finger 104 of flexible board 125 of backplane 71. Holes 770, 771, 772 . . . 779 are connected to ground bus 191.

Referring to FIGS. 7, 8, 9 and 10, there is shown component side 129 of rigid board 74. Holes 780, 781, 782 . . . 789 are connected respectively with holes 750, 751, 752 . . . 759 by printed wiring. Thus, when LED 67 is plugged into recess 699 of housing front 78, the arms of the LED make contact with electrical contacts 619 and 639. These two contacts 619 and 639 project through recess 659 and 679 within housing rear 76 and through holes 759 and 779 within rigid board 74 respectively. Hole 779 is connected to ground potential and hole 759 is connected through hole 789 to the TL terminal in recess 489 of housing rear section 76.

Figure 10:
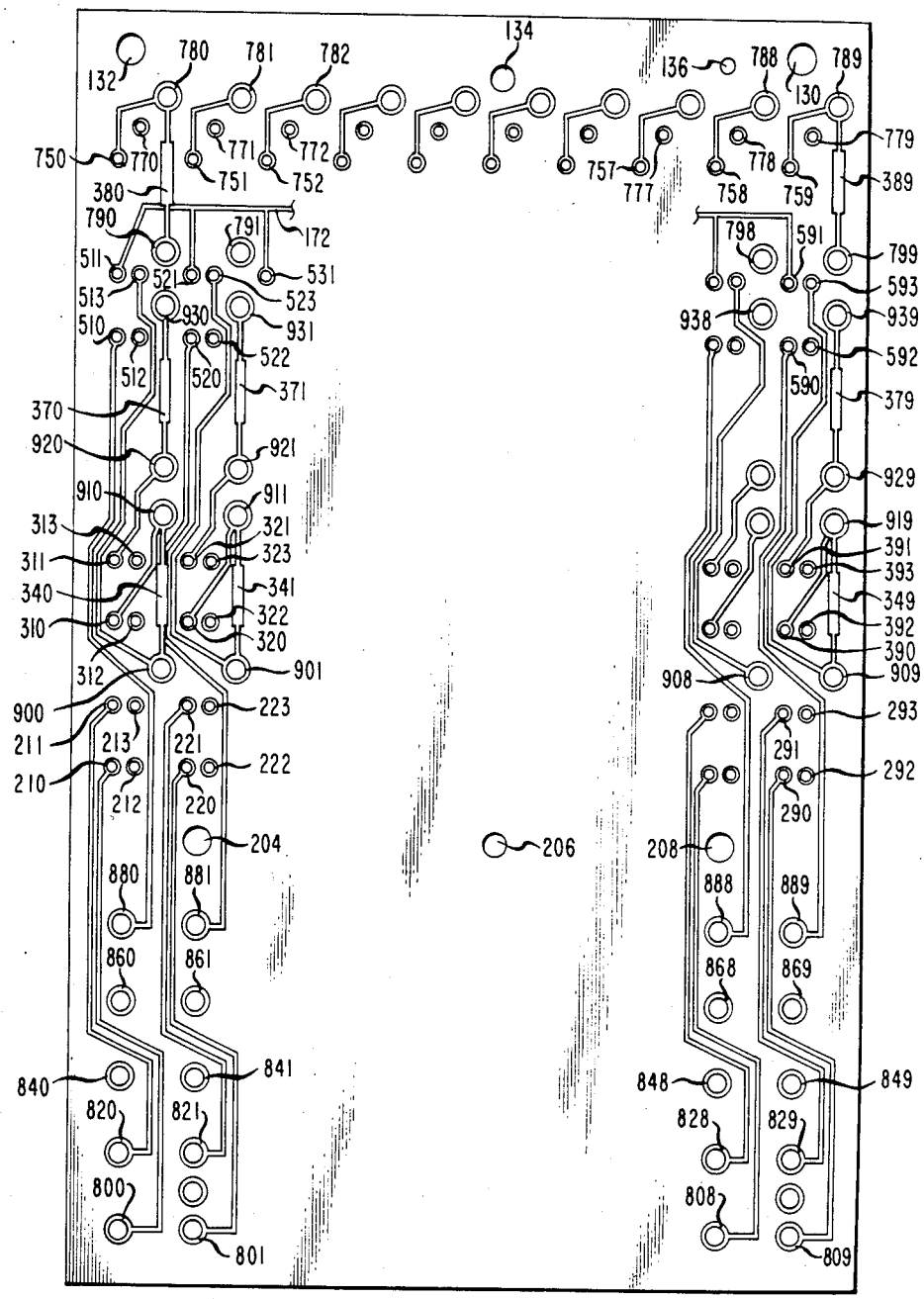

More particularly, referring to FIGS. 9 and 10 together, one end of resistor 389 is terminated on hole 789 while the other end is terminated on hole 799. Likewise, a plurality of resistors 380, 381, 382 . . . are terminated between holes 780 and 790, 781 and 791, 782 and 792 . . . . Printed wiring connects holes 799, 798, 797 . . . 790 with holes 590, 580, 570 . . . 510. Holes 510, 520, 530 . . . 590 are connected respectively with TL holes 880, 881, 882 to receive and retain by a snap lock fit within each, a terminal such as element 419 of FIG. 7. Holes 510, 520, 530 each a long electrical contact such as element 568 of FIG. 7.

Referring to FIGS. 9 and 10, holes 511, 521, 531 . . . 591 are interconnected by a bus 172. Hole 511 is connected by printed wiring 193 with finger 192. Finger 192 communicates with finger 106 to provide a supply of −48 volts. Each hole 511, 521, 531 . . . 591 is aligned with corresponding recess 515, 525, 535 . . . 595 so as to receive and retain a long electrical contact, such as element 568 of FIG. 7.

Holes 513, 523, 533 . . . 593 are connected via printed wiring to holes 900, 901, 902 . . . 909 respectively. Resistors 340, 341, 342 . . . 349 are connected between holes 900, 901, 902 . . . 909 and 910, 911, 912 . . . 919 respectively. Holes 910, 911, 912 . . . 919 are connected via printed wiring to holes 310, 320, 330 . . . 390 which are aligned with recesses 314, 324, 334 . . . 394 of housing front 76 of FIG. 7 to receive and retain therewithin short electrical contacts, one of which is shown in FIG. 7 as element 298. Holes 910, 911, 912 . . . 919 are connected also via printed wiring with finger 152, 156, 160 . . . 188. Finger 152 communicates with finger 112 on flexible board 125 of backplane 71 and with the tip conductor of the OUT path. Thus, this set of fingers represents the tip of the OUT path. Holes 513, 523, 533 . . . 593 are aligned with recesses 517, 527, 537 . . . 597 within larger recesses 518, 528, 538 . . . 598 in housing rear 76 of FIG. 7. These recesses 517 . . . 597 and holes 513 . . . 593 receive and retain short electrical contacts, shown in FIG. 7 as element 569.

Referring to FIGS. 9 and 10, holes 512, 522, 532 . . . 592 are connected by printed wiring with holes 930, 931, 932 . . . 939 respectively. Resistors 370, 371, 372 . . . 379 are connected between these holes 930 . . . 939 and holes 920, 921, 922 . . . 929 respectively. These holes 920 . . . 929 are connected to holes 311, 321, 331 . . . 391 which are aligned with recesses 315, 325, 335 . . . 395 in housing rear section 76 to receive and retain therewithin a plurality of short electrical contacts, one of which is shown in FIG. 7 as element 298.

Holes 512, 522, 532 . . . 592 are aligned with recesses 516, 526, 536 . . . 596 within recesses 518, 528, 538 . . . 598 of housing rear section 76 to receive and retain therewithin short electrical contacts, one of which is shown in FIG. 7 as element 569.

Holes 920, 921, 922 . . . 929 are connected also to fingers 153, 157, 161 . . . 189. Finger 189 communicates with finger 149 on rigid board 71 of FIG. 7 and thereby provides the ring side of the OUT path.

Referring to FIG. 9, there is shown a plurality of holes 313, 323, 333 . . . 393 connected respectively by printed wiring to holes 840, 841, 842 849. Holes 313, 323, 333 ... 393 are aligned with recesses 317, 327, 337 ... 397 to receive and retain therewithin short electrical contacts, one of which is shown in FIG. 7 as element 299.

Holes 840, 841, 842 ... 849 are aligned with recesses 440, 441, 442 ... 449 of housing rear 76 respectively to receive and retain therewithin a terminal, one of which is shown in FIG. 7 as element 419. This terminal represents the ring conductor of the OUT path.

Referring to FIG. 9, there is shown a plurality of holes 312, 322, 332 ... 392 connected to holes 860, 861, 862 ... 869 respectively. Holes 860, 861, 862 ... 869 are aligned with recesses 460, 461, 462 469 respectively to receive and retain therewithin a terminal, one of which is shown in FIG. 7 as element 419. These terminals correspond to the tip conductor of the OUT path. Holes 312, 322, 332 ... 392 are aligned with a plurality of recesses 316, 326, 336 ... 396 to receive and retain therewithin a plurality of short electrical contacts, one of which is shown in FIG. 7 as 299.

In the normal position, contacts in recesses 315 and 317 are in direct contact with each other, as shown in FIG. 6, thereby taking the ring side of the OUT path from the digital circuit which is terminated on backplane 71 to a terminal in recess 440 of rear section 76 of FIG. 7. A jumper wire connects terminal in recess 440 with a ring terminal of an IN path in another housing rear section (not shown).

Likewise, in the normal position, contacts in recesses 314 and 316 are in direct contact with each other, as shown in FIG. 6, thereby taking the tip side of the OUT path from a digital circuit which is terminated on backplane 71 to a terminal in recess 460 of rear section 76 of FIG. 7. A jumper wire connects terminal in recess 460 with a tip terminal of an IN path in another housing rear section. Thus, recesses 440 and 460 in housing rear section 76 provide an access to the OUT path.

Referring to FIGS. 9 and 10 again, there is shown a plurality of holes 800, 801, 802 ... 809 connected via printed wiring to a plurality of holes 210, 220, 230 ... 290. Holes 800 ... 809 are aligned with a plurality of recesses 400, 401, 402 ... 409 to receive and retain by a snap lock fit therein terminals, one of which is shown in FIG. 7 as element 419. This represents the ring side of the IN path.

Holes 210, 220, 230 ... 290 are aligned with a plurality of recesses 214, 224, 234 ... 294 through housing rear 76 to receive and retain therewithin short electrical contacts, one of which is shown in FIG. 7 as element 298.

Holes 211, 221, 231 ... 291 are aligned with recesses 215, 225, 235 ... 295 of housing rear 76 to receive and retain therewithin short electrical contacts, one of which is shown in FIG. 7 as element 298. These holes 211 ... 291 are connected with holes 820, 821, 822 ... 829 via printed wiring. Holes 820 ... 829 are aligned with recesses 420 ... 429 in housing rear section 76 to receive and retain therewithin by a snap lock fit a plurality of terminals, one of which is shown in FIG. 7 as element 419. This terminal corresponds with the tip conductor of the IN path.

Referring to FIGS. 9 and 10, there is shown a plurality of holes 212, 222, 232 ... 292 which are aligned with recesses 216, 226, 236 ... 296 through housing rear 76 to receive and retain therewithin short electrical contacts, one of which is shown in FIG. 7 as element 299. These holes 212 ... 292 are connected via printed wiring on surface 127 of rigid board 74 to fingers 150, 154, 158 ... 186. Finger 150, for example, communicates with finger 110 of backplane 71 of FIG. 8, and to the ring side of the IN path.

Holes 213, 223, 233 ... 293 are connected via printed wiring to a plurality of fingers 151 ... 183. Finger 151, for example, communicates with finger 111 of backplane 71 of FIG. 7 and to the tip side of the IN path. These holes 213 ... 293 are aligned with a plurality of recesses 217, 227, 237 ... 297 in housing rear section 76 to receive and retain therewithin short electrical contacts, one of which is shown in FIG. 7 as element 299.

In the normal position, electrical contacts such as elements 244 and 246 of FIG. 6 are in direct contact with each other when housed in recesses 214 and 216, thereby extending the ring side of the IN path from the terminal in recess 400 to backplane 71 and thence to the digital system. Likewise, in the normal position, electrical contacts in recesses 215 and 217 are in direct contact with each other and cooperate to extend the tip side of the IN path from the terminal in recess 420 to backplane 71 and thence to the digital system.

Figure 11:
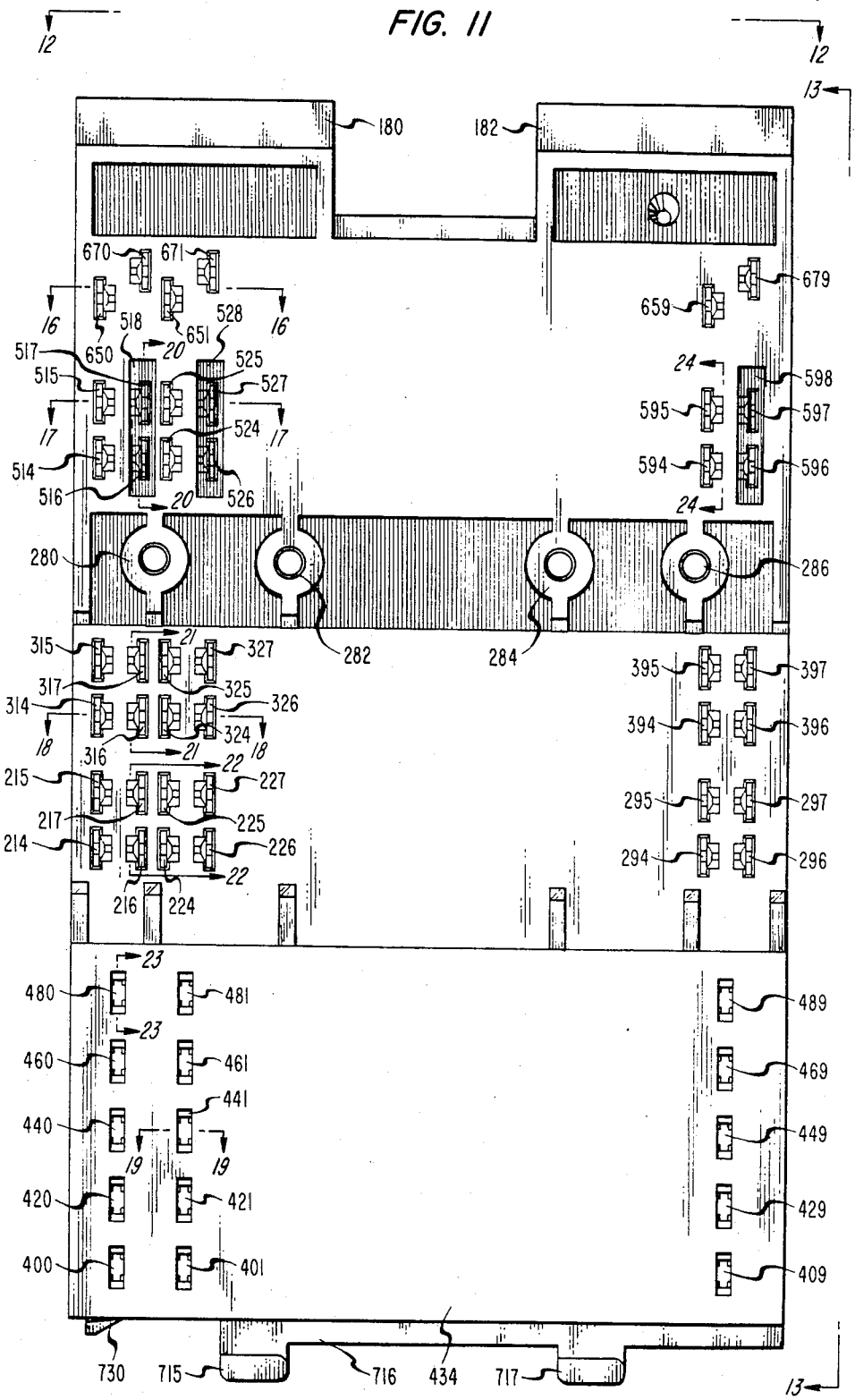
FIGS. 11 and 12 show, respectively, the front elevational view and the top plan view of the rear section of the housing unit for the connecting block.
Figure 16:
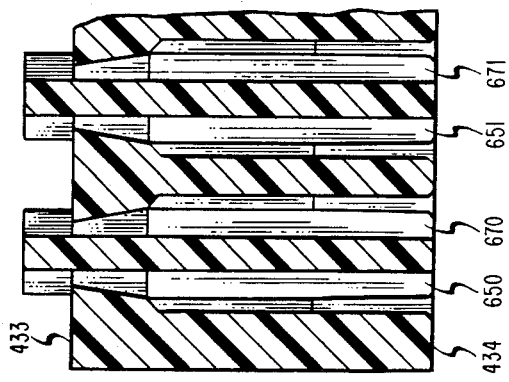

Referring to FIG. 11, there is shown a front elevational view of housing rear section 76 showing surface 434 shown earlier in FIG. 7. FIGS. 16 through 27 show details of various sections of housing rear 76 and which are useful in studying the embodiment of the present invention. There is shown in FIG. 11 a plurality of pairs of recesses 650 and 670, 651 and 671, 652 and 672 ... 659 and 679, each recess being used to receive and retain therewithin a long electrical contact. Each pair of electrical contacts, for example elements 619 and 639 of FIG. 7, face each other but do not touch because the corresponding recesses 659 and 679 are offset, one below the other. Thus, there are two rows of recesses: 650, 651, 652 ... 659 and 670, 671, 672 ... 679. A plan view in cross section of a few of these recesses is shown in FIG. 16. Each pair of long electrical contacts housed within a pair of these recesses receives a light emitting diode.

Referring to FIG. 11 again, there is shown a plurality of sets of recesses 514, 515, 516 and 517 within 518 ... 594, 595, 596 and 597 within 598. Recesses 514 and 515 are arranged one below the other. Likewise, recesses 516 and 517 are arranged one below the other but both within larger recess 518. Further, recesses 514, 524, 534 ... 594 are collinear. Likewise, recesses 515, 525, 535 ... 595 are collinear. Recesses 514 and 515 house long electrical contacts which are normally not in contact with any other electrical contact. When a plug is inserted into the jack, however, an electrical path is closed and current flows through the contacts in these recesses 514 and 515 to light the corresponding LED. Recesses 516 and 518 house short electrical contacts, for example contacts 569 of FIG. 7, which are multipled to the ring and tip sides of the OUT path, as shown in FIG. 6. A set of these recesses, for example 514, 515, 516 and 517, along with the electrical contacts therewithin is referred to as a monitor (MON) jack.

Figure 17:
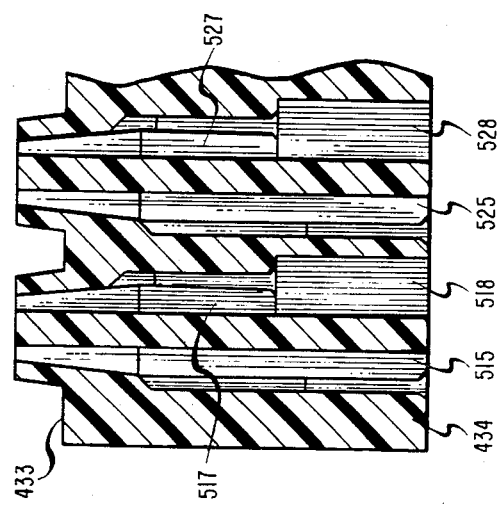

Referring to FIG. 17, there is shown a cross sectional plan view of some of these recesses. It can be seen that recess 517 which appears to be within the larger recess 518 in the front elevational view extends the entire width of the rear section 76. The larger recess 518, however, extends only partially. This larger recess receives finger-like projections shown as elements 760 and 810, in FIG. 31 hereinbelow, from housing front section 78 when in the assembled state to hold the electrical contacts firmly in place and to secure the front and rear sections 78 and 76.

Figure 20:
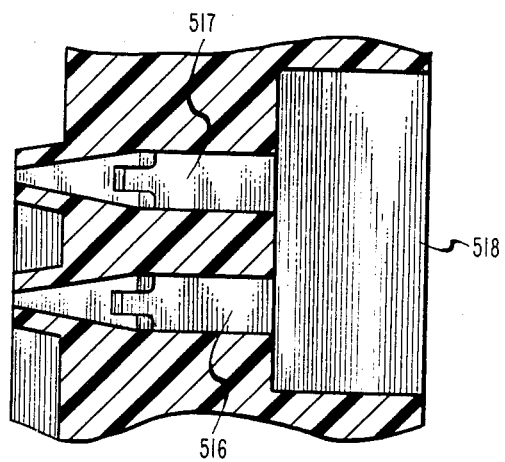

Referring to FIG. 20, there is shown in a sectional side elevational view details of recesses 516 and 517 within larger recess 518.

Figure 24:
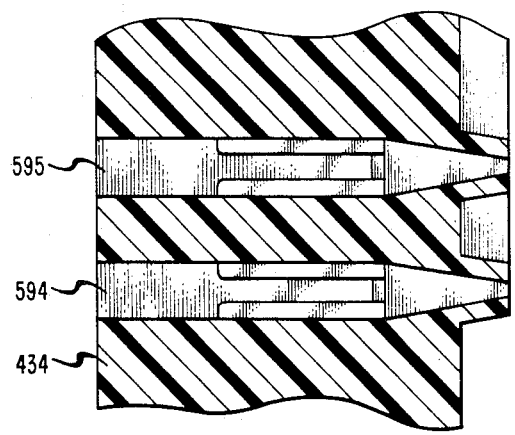
Figure 25:
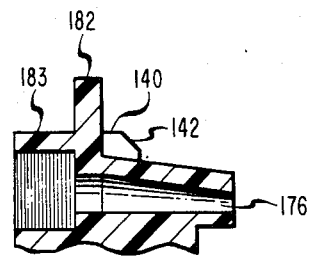
FIG. 25 shows details of a cavity in the rear section of the housing for the connecting block to funnel a pin from a grounding bus to the rigid wiring board.
Figure 27:
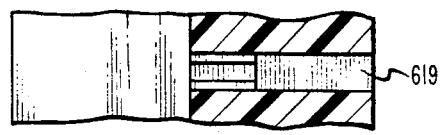
Figure 28:
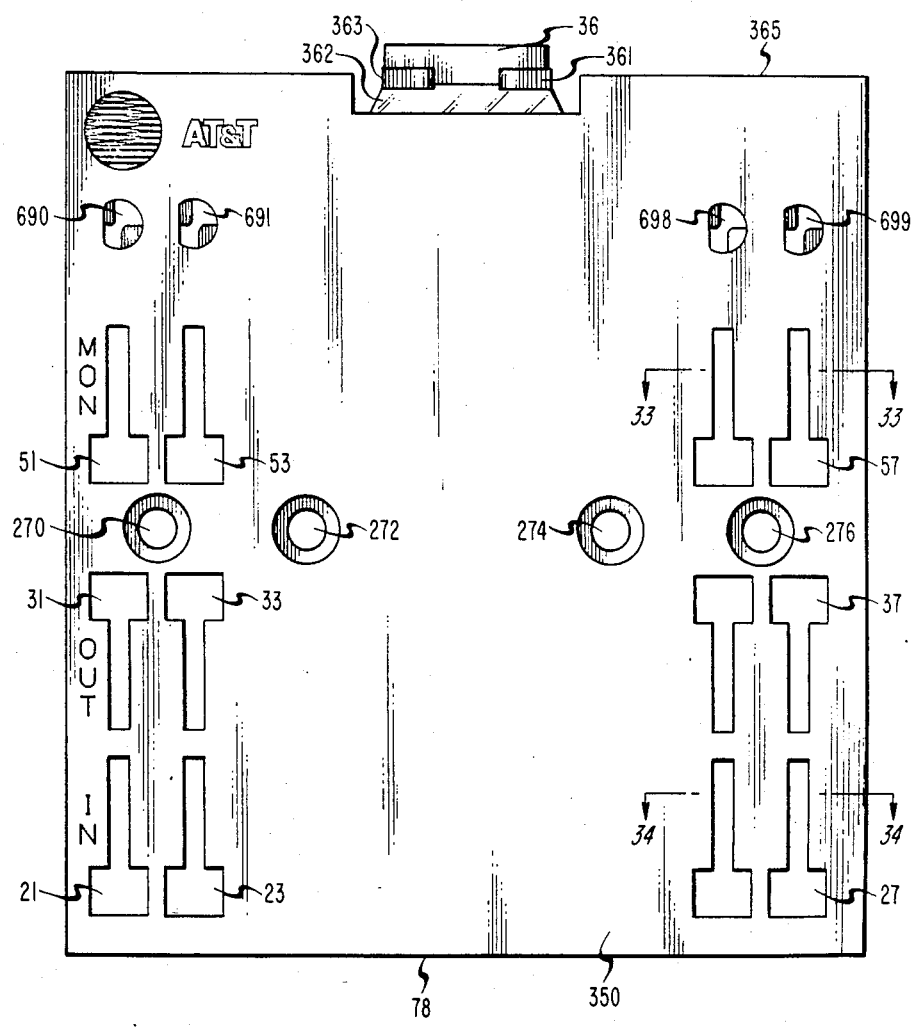
Figure 31:
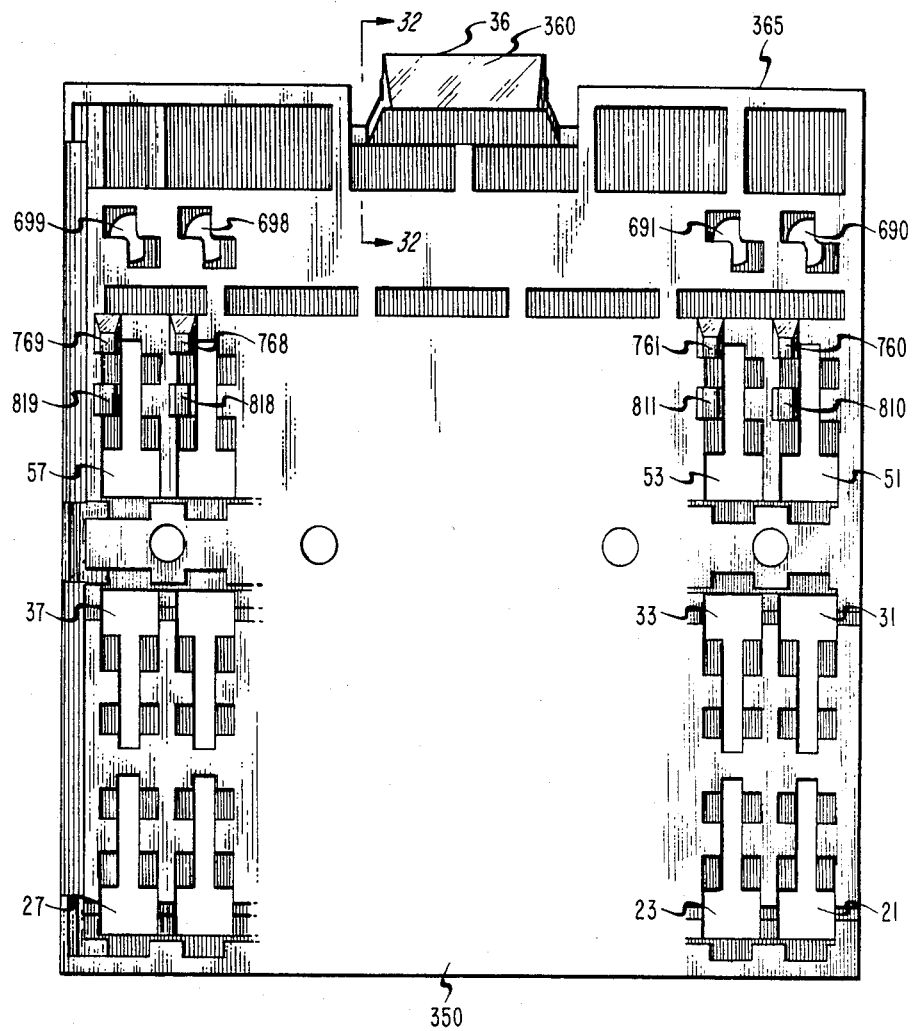
Figure 32:
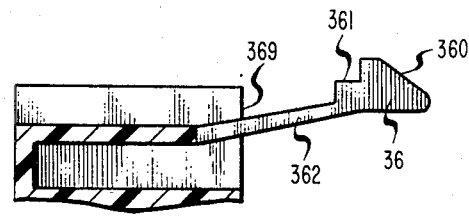

A side sectional view of recesses 595 and 594 is shown in FIG. 24.

Holes 280 . . . 284 receive screws, one of which is shown in FIG. 7 as 266, to secure housing front section 78 to housing rear section 76.

Referring to FIG. 11 again, there is shown a plurality of sets of recesses 314, 315, 316 and 317 . . . 394, 395, 396 and 397, for housing short electrical contacts comprising the OUT jacks. Recesses 314 and 316, 324 and 326, 334 and 336 . . . 394 and 396 are collinear. Likewise, recesses 315 and 317, 325 and 327, 335 and 337 . . . 395 and 397 are collinear. Further, recesses 315 and 314 are above one another. Recesses 314 and 315 receive and retain short electrical contacts, such as element 288 of FIG. 7, and correspond to the tip and ring sides respectively of the OUT path. The electrical contacts in recesses 314 and 315 are in direct contact with the contacts in recesses 316 and 317 in the normal state. By this means the tip and ring of the OUT path are multipled to the OUT terminals within recesses 460 and 440 by means of wiring on rigid board 74 as disclosed hereinbelow.

Figure 18:
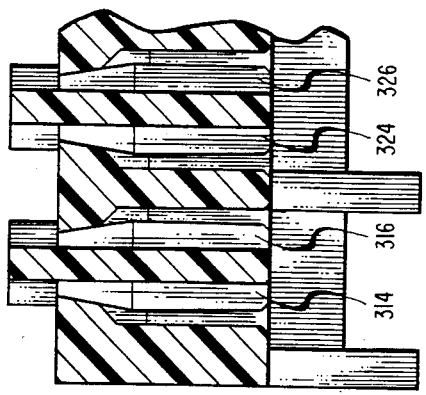
FIGS. 16 through 24 show views taken along diverse sections of the housing rear of the connecting block.
Figure 21:
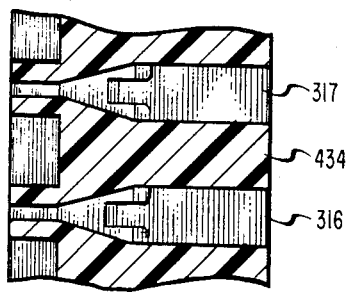

FIG. 18 shows a plan elevational view in section through recesses 314, 316, 324 and 326. FIG. 21 shows a side elevational view through recesses 316 and 317.

Figure 22:
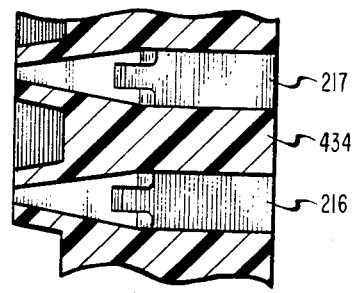

Referring to FIG. 11, there is shown a plurality of recesses 214, 215, 216 and 217 . . . 294, 295, 296 and 297 which are used to form the IN jacks. Recesses 214 and 216, 224 and 226, 234 and 236 . . . 294 and 296 are collinear. Likewise, recesses 215 and 217, 225 and 227, 235 and 237 . . . 295 and 297 are collinear. Further, recess 215 and 214 are above one another. These recesses receive and retain short electrical contacts, one of which is shown in FIG. 7 as element 288. Recesses 216 and 217, as shown in FIG. 6, are connected to the ring and tip of sides of the IN path. Recesses 214 and 215 have electrical contacts which in the normal state are in direct contact with the corresponding contacts within recesses 216 and 217 respectively. By this means the ring and tip sides of the IN path are multipled over to the IN terminals in recesses 400 and 420 respectively. FIG. 22 shows a side elevational view in section of recesses 216 and 217.

Figure 19:
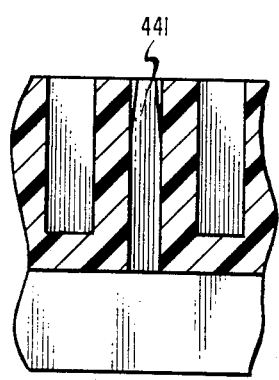
Figure 23:
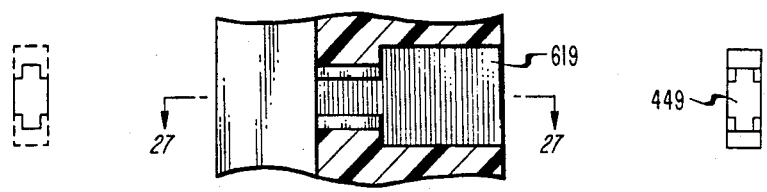

Referring to FIG. 11 again, there is shown a plurality of recesses in five sets of rows. Each recess houses a terminal, such as element 419 shown in FIG. 7, and is retained therewithin by a snap lock fit. Each recess is multipled over to a corresponding recess in the upper part of housing rear section 76 through rigid board 74 as stated hereinabove. The first row comprises recesses 480 . . . 489 for housing tracing lamp (TL) terminals. The next two rows of recesses 460 . . . 469 and 440 . . . 449 house the ring and tip sides of the OUT path. The lower most rows of recesses 420 . . . 429 and 400 to 409 house the ring and tip sides of the IN path. A side elevational view in section of recess 480 is shown in FIG. 23. A plan view in section of recess 441 is shown in FIG. 19.

Figure 26:
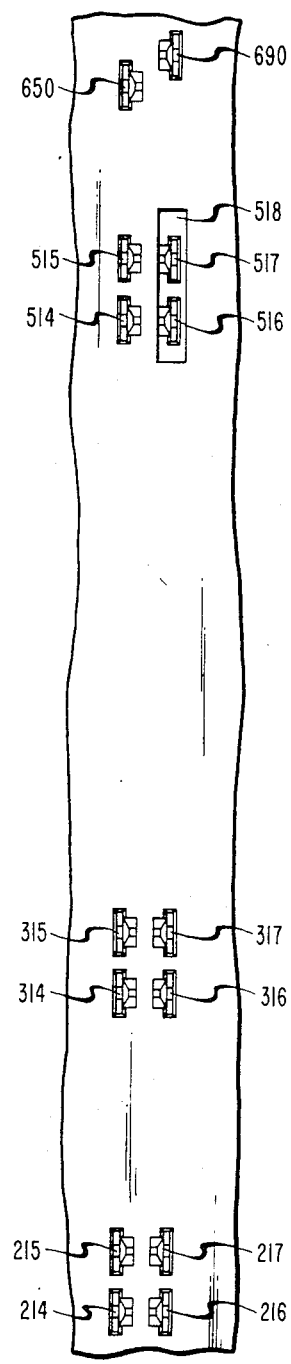
FIGS. 26 and 27 show the front view of the openings in the rear section of the housing for the contacts and the cross-connect terminals, respectively.

FIG. 26 shows details of the recesses in the upper half of housing rear section 76 which form the jacks.

Figure 15:
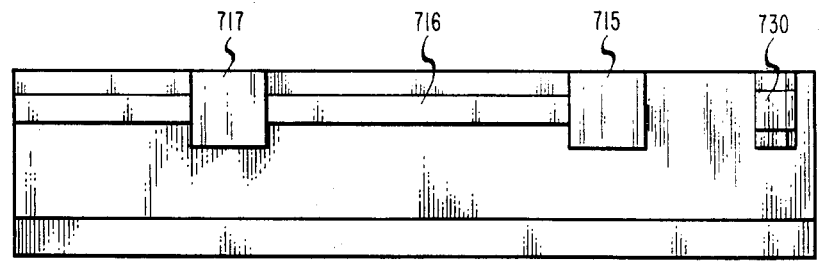
FIG. 15 shows the bottom plan view of the rear section of the housing unit for the connecting block.

Referring to FIG. 7 briefly, there is shown two members 715 and 717 projecting from the bottom of housing rear section 76. These two members are interconnected by a central rib 716. This detail is seen more clearly in FIG. 15 showing the bottom plan view of housing rear section 76. Referring to FIGS. 7, 11 and 15 concurrently, there is shown a small catch 730, on the bottom of housing rear section 76, which has a surface sloping down towards projecting member 715. When pedestal 32 is assembled over projecting members 715 and 717 and urged toward ramp 730, the sloping surface forces catch 731 downwards. Pedestal 32 being fabricated from a synthetic material having some elasticity yields to this gentle force until catch 731 of pedestal 32 is immediately under ramp 730 when catch 731 snaps upwards and locks into position. Thus, ramp 730 and catch 731 serves the function of locking pedestal to housing rear section 76 and insuring against accidental disenagement.

Figure 12:
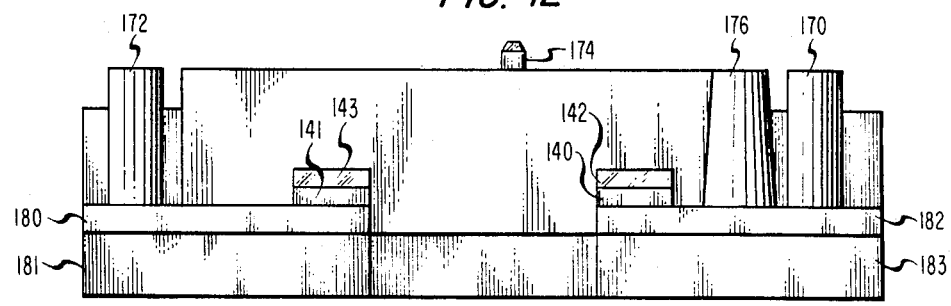

Referring to FIGS. 12 and 7, there is shown a top plan view of housing rear section 76. Projecting element 174 serves to align housing rear section 76 and rigid board 74 by cooperating with recess 134 on rigid board 74. Elements 170 and 172 align with corresponding holes 130 and 132 on rigid board 74 and provide thereby a means for securing the two members together. A hole through element 176 on housing rear section 76 and hole 136 on rigid board 74 cooperate to receive grounding pin 135 of ground bar 138. There are shown two elements 141 and 140, having respectively sloping surfaces 143 and 142. The upper surfaces of elements 141 and 140 and the upper surface of elements 363 and 361 on the landing 362 of tang 36 of FIG. 7 are in substantially direct contact with the lower edge 87 of crossarm 38 of FIG. 4 when connecting block 24 is secured in a frame.

Figure 13:
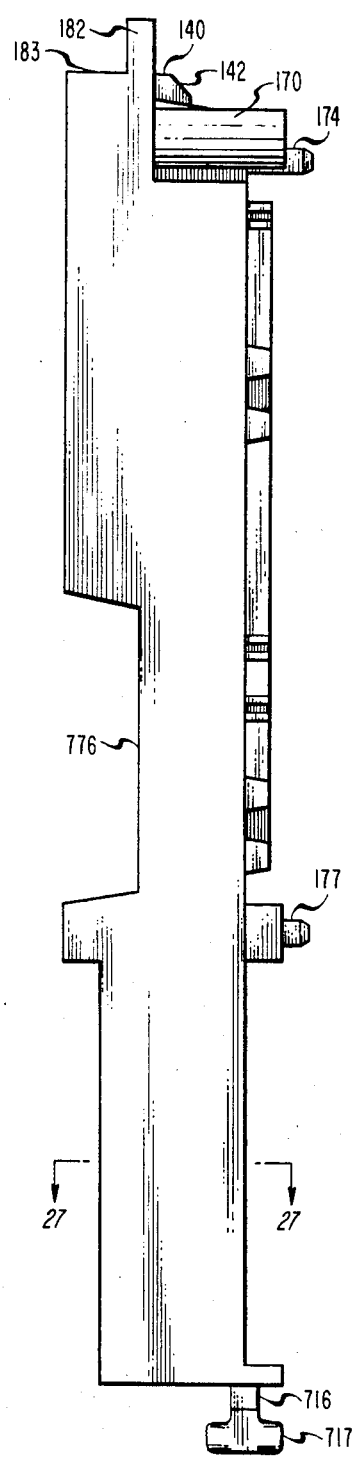

FIGS. 13 and 14 show a side elevational view and a rear elevational view of housing rear section 76. These views aid in studying the details of housing rear section 76 disclosed hereinbelow.

Referring to FIGS. 28, 29, 30 and 31 there are shown front elevational, top plan, side and rear elevational views of housing front section 78. There is shown a row of recesses 690 . . . 699, each for receiving and retaining a LED, one of which is shown in FIG. 7 as element 67. Details of recess 690 is shown in front elevational view in FIG. 38 and in sectional view in FIG. 36. Recess 690 is made so that each of the projecting arms of an LED make contact with one of the contacts in the corresponding recesses of housing rear section 76. For example, recess 690 is aligned with the set of recesses 650 and 670.

A plurality of recesses 51 . . . 57 provide access to the MON jacks. Recess 51 for example is aligned with the set of recesses 514, 515, 516 and 517. Immediately adjacent to each recess 51 . . . 57 there are provided a set of projecting members arranged in two rows 760 . . . 769 and 810 . . . 819. Adjacent to recess 51 on rear surface 352 there are projecting members 760 and 810. As stated hereinabove, these two members keep contacts in recesses 516 and 517 of rear section 76 firmly in place. Details of access slots 55 and 57 in sectional plan view is shown in FIG. 33.

Holes 270 . . . 276 on housing front section 78 are adapted to align with holes 280 . . . 286 on housing rear section 76 for securing the two sections together with a plurality of screws, one of which is shown in FIG. 7 as element 266.

There is shown a row of recess 31 . . . 37 for access to a plurality of OUT jacks. Recess 31 for example provides access to contacts in the set of recesses 314, 315, 316 and 317 of FIG. 7.

A plurality of recesses 21 . . . 27 provide access for IN jacks. Recess 21 for example corresponds with recesses 214, 215, 216 and 217 of the housing rear section 76 of FIG. 7. A plan sectional view of recesses 25 and 27 is shown in FIG. 34.

Referring to FIGS. 29 through 32, tang 36 has a sloping forward section 360 for guiding assembled connecting block 24 past crossarm 38 of FIG. 4 into position when being inserted into frame 10. As stated hereinabove, there are two end elements 361 and 363 each being a raised ridge having substantially flat upper surfaces which cooperate with elements 141 and 140 of FIG. 12 to hold the assembled connecting block 24 in place against the bottom edge 87 of crossarm 38 of FIG. 4.

The space between the two raised ridges 361 and 363 provides space for insertion of a screw driver or similar tool to depress tang 36 and release its grip on crossarm 38 of FIG. 4 so that connecting block 24 may be removed from frame 10. The sloping surface 360 of tang 36 is connected to housing front section 78 by a resilient landing or neck 362.

Figure 35:
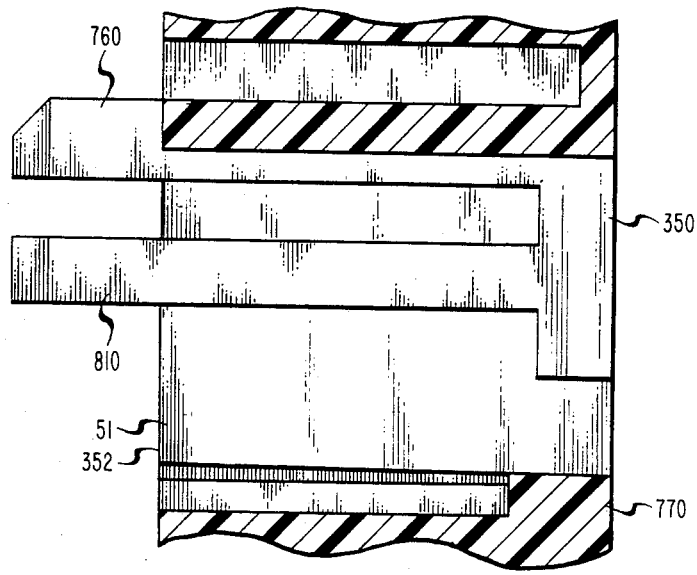
Figure 36:
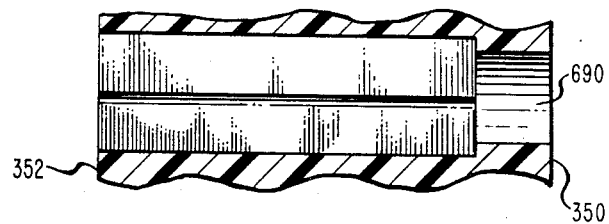
Figure 38:
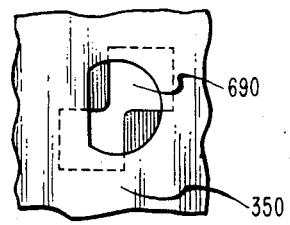

Referring to FIG. 37, there is shown details of a column of recesses 21, 31, and 51 and of LED recess 690 as seen from rear surface 352 of front section 78. FIG. 35 shows details of recess 51 in side elevational view taken in section.

Figure 39:
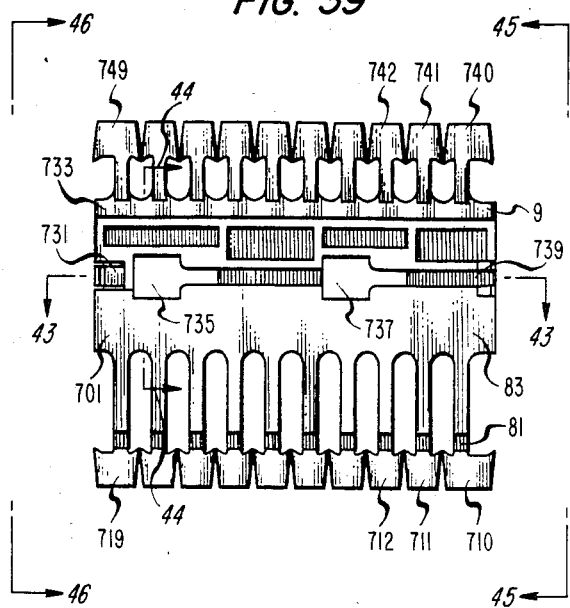
FIGS. 39 through 42 show, respectively, the top plan view, the side elevational view, the bottom plan view, and the front elevational view of the fanning strip for the pedestal of the connecting block.
Figure 40:
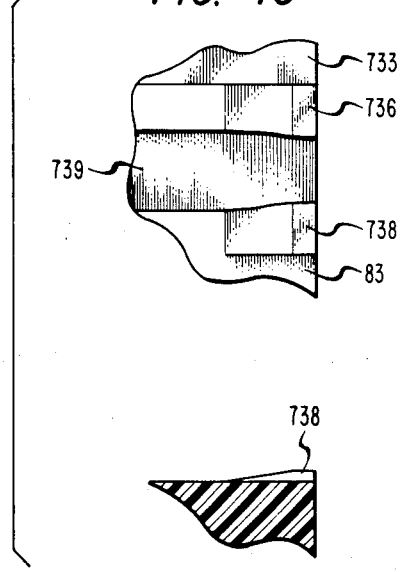
Figure 41:
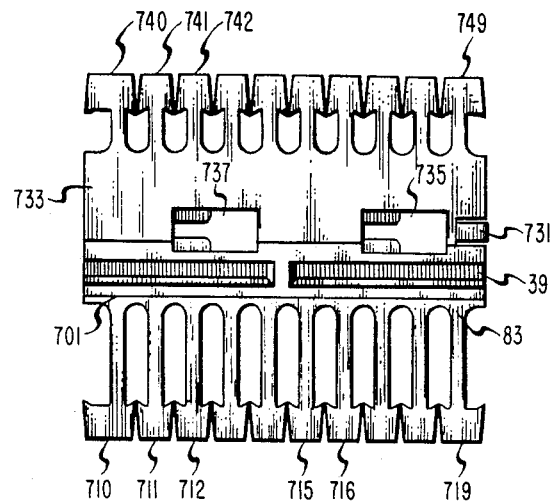
Figure 42:
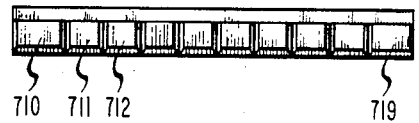
Figure 43:
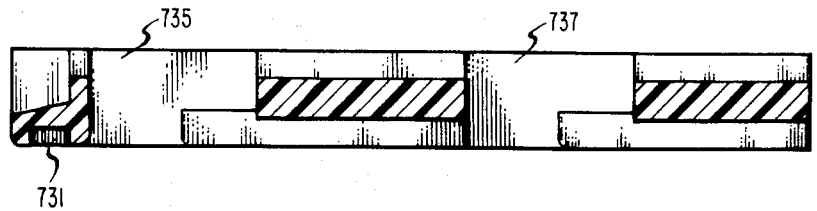

Referring to FIGS. 39, 41 and 42 there are shown the top plan, bottom plan and front elevational views of pedestal 32. FIGS. 45 and 46 show the two side elevational views from left and right. FIGS. 43 and 44 show details in sectional view and FIG. 40 shows another detail being expanded. Referring to these figures collectively, there is shown a forwardly projecting fanning strip 83 comprising a plurality of fingers 710, 711, 712 . . . 719. Jumper wires wrapped on terminals, such as 419 of FIG. 7, are tucked away in a slot between any two fingers 710 . . . 719.

A similar rearwardly projecting fanning strip 733 has a plurality of fingers 740, 741, 742 . . . 749. These are used for securing cable wire leads wrapped on terminals on backplane 71 of FIG. 4. There is shown a longitudinal slot 9 running along the top surface of pedestal 32 near the rearwardly projection 733. Slot 9 receives end 8 of backplane 71 as shown more clearly in FIG. 4.

There is shown a longitudinal slot 81 running along the upper surface of pedestal 32 in the forwardly projecting part 83. This slot, as shown in FIG. 5, is used to rest connecting block 56 on the upper edge 90 of upwardly projecting panel 99 which is connected with crossarm 50 while terminating conductors from and to digital systems on terminals 91 . . . 98 projecting outwardly from connecting block 56.

There is shown another longitudinal slot 39 running along the bottom surface of pedestal 32. Slot 39 receives the upper edge of a crossarm, for example, crossarm 34 of FIG. 4, when being fastened to a frame as shown in FIGS. 4 and 5.

There is provided also a longitudinal slot 739, along a portion of pedestal 32, having larger holes 735 and 737 extending through the pedestal. Holes 735 and 737 receive projecting elements 715 and 717 of housing rear section 76 of FIG. 7 while the longitudinal cavity receives rib 716 of rear section 76. A recess 731 as stated hereinabove receives element 730 projecting from the bottom surface of housing rear section 76.

The upper surface of pedestal 32 at the end opposite to end having recess 731 has two raised ridges 736 and 738 along the sides of slot 739. These ridges 736 and 738 taper from the upper surface of pedestal 32 upwards towards one end of pedestal 32. These ridges 736 and 738 serve the function of forcing pedestal 32 against the projecting elements 715 and 717 of FIG. 15.

Figure 49:
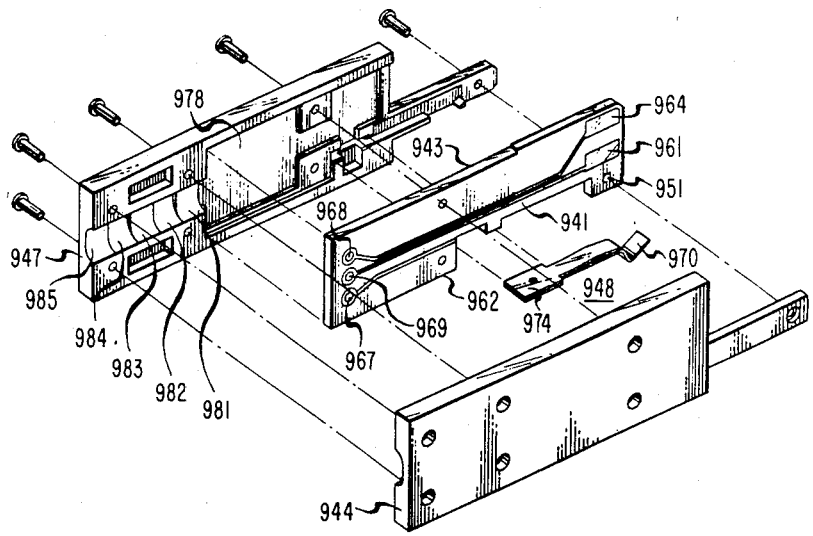
FIG. 49 shows the plug of FIG. 48 in exploded view.

Referring to FIGS. 48 and 49, there is shown a plug 940. Plug 940 comprises a printed wiring board 942 fastened between two halves of a shell 944 by a plurality of rivets 951 . . . 957. A keeper spring 948 retains plug 940 within a jack by cooperating with the aforesaid ground members 133, 137, 139 of FIG. 7. This keeper spring 948 also provides a connection between the ground potential of connecting block 24 and the shield of jumper cable 950 via terminal 967. Jumper cable 950 is secured within the two halves of shell 944 by being retained in area 985. Jumper cable 950 has tip and ring conductors connected at terminals 968 and 969 respectively. Tip and ring terminals 968 and 969 are connected via printed wiring on board 942 to contact areas 964 and 961 respectively. These contact areas are engaged by electrical contacts in the MON jack, the IN jack or the OUT jack of FIGS. 7 or 47 when plug 940 is inserted therewithin.

Figure 50:
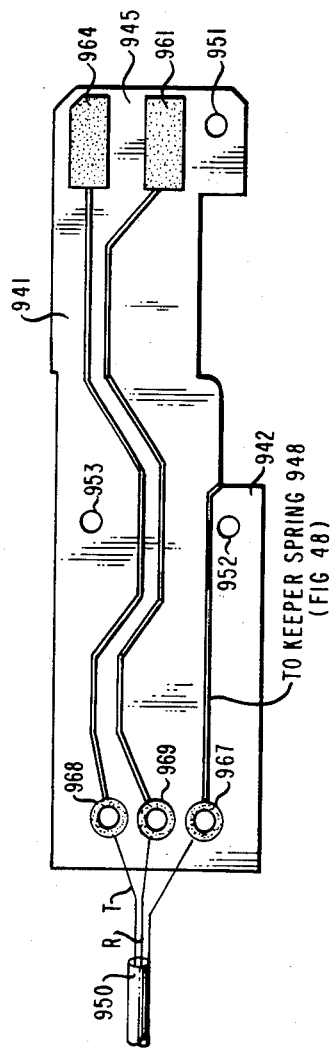
FIGS. 50 and 51 show the two surfaces of the printed board of FIG. 48.

Referring to FIG. 50, there is shown side 941 of printed wiring board 942 of FIG. 48. Contact areas 961 and 964 are located near end 945 of plug 942. Holes 951, 952 and 953 permit the introduction of rivets, or the like, for securing printed wiring board 942 between the two halves of shell 944. There are shown also three terminals 968, 969 and 967 for connection of the tip and ring conductors and the shield respectively of jumper cable 950 to the contact areas 964 and 961 and to keeper spring 948 (shown in FIG. 48).

Figure 51:
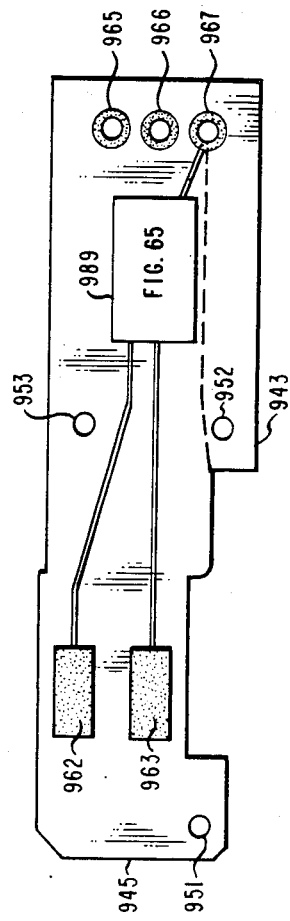

Referring to FIG. 51, there is shown side 943 of printed wiring board 942. There are shown terminals 965 and 966 which are not used on this side. Terminal 967 which connected to keeper spring 948 of FIG. 48 is connected to timer circuit 989 which is shown in detail in FIG. 65 hereinbelow. Shown in FIG. 51 near end 945 are two contact areas 962 and 963 which are connected with circuit 989. These contact areas engage the two long electrical contacts, for example, elements 544 and 545 of FIG. 6. One such long contact is shown in FIG. 7 as element 568. These long contacts are associated with the monitor (MON) jacks. Further, these contacts are not located exactly opposite to the contact areas 964 and 961. Rather, contact areas 962 and 963 are located on side 943 further away from end 945 than contact areas 964 and 961. This is necessary because when plug 940 is inserted into a MON jack, two long electrical contacts, for example elements 544 and 545 of FIG. 6, engage contact areas 962 and 963 while two short electrical contacts 546 and 547 engage contact areas 964 and 961. In the normal position long contacts 544 and 546 do not touch one another.

Contact areas 962 and 963 on surface 943 and contact areas 961 and 964 on surface 941 are made to be durable and capable of repeated insertions into and withdrawals from the jacks of FIG. 7. This durability is effected by making the pressure exerted by the electrical contacts on the contact areas sufficiently low, thereby reducing wear and tear of the contact area plating. Electrical contact pressure is reduced because of the support from the detents within ground bus 138 of FIG. 7.

When plug 940 is inserted into a MON jack, say 51 of FIG. 7, long electrical contact 545 of FIG. 6 engages contact area 962 providing a voltage supply to circuit 989. Long electrical contact 544 engages contact area 963 providing a return path from circuit 989 through resistor 380 to tracing lamp 61, causing it to light up, and to TL terminal 49. A jumper cable connects TL terminal 49 with another TL terminal not shown. Thus when tracing lamp 61 is illuminated, the corresponding tracing lamp will also be illuminated. Initially, the tracing lamps will blink for about a minute, allowing a craft person enough time to find the two ends. This function is performed in circuit 989 and will be explained in detail hereinbelow with reference to FIG. 65.

Referring to FIG. 52, there is shown a side elevational view of plug 940. The projecting front sections 946 of shell half 944 and 949 of shell half 947 serve two functions. They secure printed wiring board 942 at the front end and provide a seat for end 970 of keeper spring 948 of FIG. 48.

Figure 53:
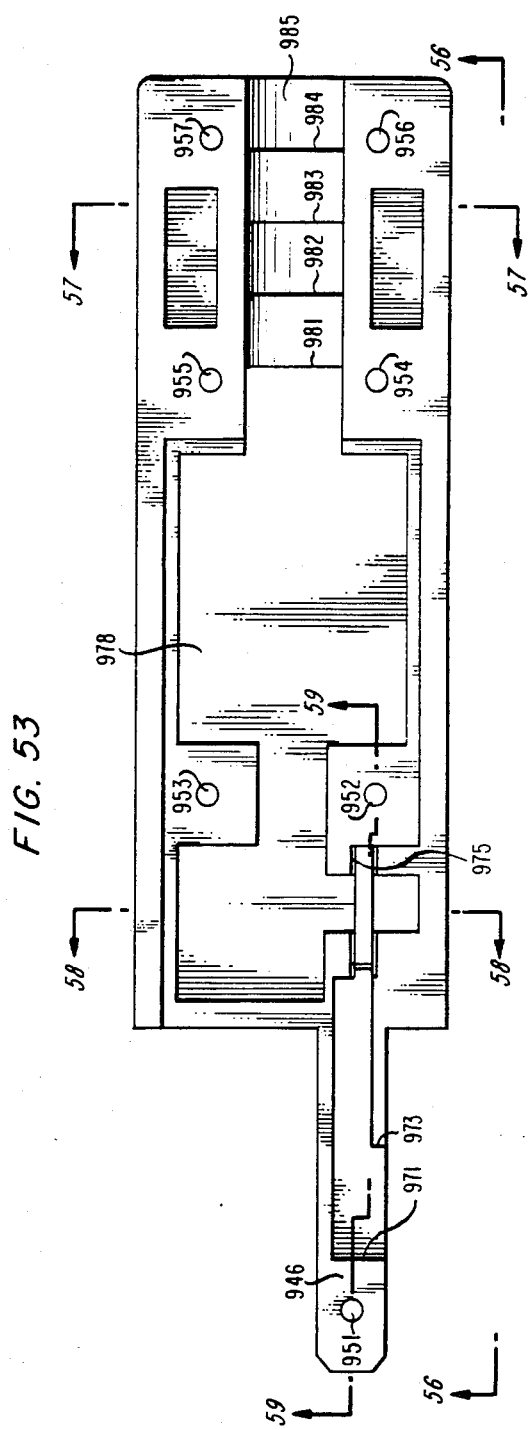
Figure 58:
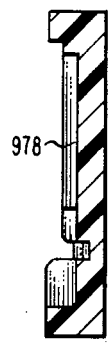
Figure 59:

There are shown different views of shell half 944 in FIGS. 53 (front elevation), 54 (left side), 55 (right side), 56 (top plan), 57, 58 and 59 different details in section. There is shown front projection 946 having a hole 951 for a receiving a rivet, or the like. A corner 971 serves to anchor end 970 of keeper spring 948 and to absorb the compression and expansion forces from keeper spring 948. The other end 974 of keeper spring 948 rests against a corner 975. Also shown are holes 952 . . . 957 for the other rivets, or the like. A cavity 978 provides space for components mounted on the surfaces 941 or 943 of printed wiring board 942. The area 985 of shell half 944 has a plurality of ridges 981, 982, 983 . . . 984 for gripping cable 950 of FIG. 48 and preventing its straining the terminations on terminals 967, 968 and 969 of FIG. 50 from movement. An alternative embodiment comprises a metal band (not shown) around test cord 950 and retained within area 985.

Figure 60:
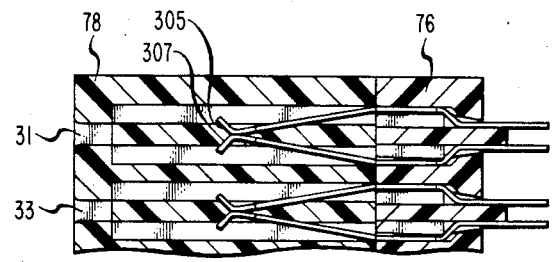
FIG. 60 shows a cross section of a plan view of a jack which is used for a providing temporary path.

Referring to FIG. 60 there is shown a plan view of connecting block 24 of FIG. 47 in partial section with a plurality of OUT jacks comprising a pair of short electrical contacts 305 and 307. In the normal position, contacts 305 and 307 communicate with each other, extending the ring side of the OUT path from backplane 71 to terminal 45 as shown in FIG. 6. Immediately below contacts 305 and 307, there is a set of contacts 304 and 306, not shown in FIG. 60. These contacts 304 and 306 extend the tip side of the OUT from backplane 71 to terminal 47, also shown in FIG. 6.

When plug 940 is inserted in OUT jack 31 the anterior section 946 along with the printed wiring board is lodged between electrical contact pairs 305, 307 and 304, 306, as shown in FIG. 61. Contacts 304 and 305 engage contact areas 964 and 961 on printed wiring board 942, disconnecting the ring and tip paths to terminals 45 and 47 but extending the ring and tip paths through the ring and tip conductors of cable 950 to another jack into which is inseted a plug connected at the other end of jumper cable 950.

Referring to FIG. 62, there is shown a side elevational view of FIG. 61 in partial section. Contact areas 962 and 963 are seen on surface 943 and do not engage short contacts 306 and 307. Contacts 304 and 305 on the other side 941, however, engage contact areas 964 and 961. FIGS. 60, 61 and 62 show also the views for the IN path. The OUT jacks are similar to the IN jacks.

Figure 63:
FIG. 63 shows a cross section of a plan view of a jack which is used to monitor a circuit.

Referring to FIG. 63, there is shown a plan view in section of MON jack position 51. The jack comprises long electrical contact 545 and short electrical contact 547. These contacts 545 and 547 are housed within recesses 515 and 517 respectively of housing rear section 76 and retained therewithin by a snap lock fit. The entrance to contacts 545 and 547 is via opening 51 within housing front section 78. The isometric exploded view and assembled views of connecting block 24 are shown in FIG. 7 and 47. These contacts 545 and 547 do not touch each other. Immediately below these two contacts 545 and 547 are two similar long and short contacts 544 and 546 respectively not seen in FIG. 63.

Referring to FIG. 48, 49, 50, 51 and 64, there is shown plug 940 inserted within electrical contacts 545 and 547. Long contact 545 engages contact area 962 while short contact 547 engages contact area 964. Likewise, long contact 544 and short contact 546, both of FIG. 6, engage contact areas 963 and 961, respectively. Current from a voltage source enters backplane 71 of FIG. 6 and flows through long contact 545 through contact area 962 through circuit 989 through contact area 963 through long contact 544 through TL terminal 49 through a jumper cable to another terminal (not shown) to which the jumper cable is connected. Keeper spring 948 engages a recess within grounding member 133 of FIG. 7 which is connected via ground bar 138 to bus 191 and through backplane 71 to ground.

Referring to FIG. 65, there is shown electrical circuit 989. When plug 940 is inserted into MON jack position 51 of FIG. 64, power is supplied to integrated circuit 998, and causes timers 986 and 987 therewithin to begin operating. Integrated circuit 998 includes two timers 986 and 987 on one monolithic chip, and is a commercial product such as one manufactured by the Exar Corporation and designated commonly as a 556 timer. Alternatively, two separate timers, designated commonly as 555 timers, could be used. One of the timers 987 operates in the astable mode and causes LEDs 61 . . . 67 to flash. The other timer 986 operates in the monostable mode, and causes the flashing to cease after a predetermined interval, with LEDs 61 . . . 67 remaining on.

Resistor 991 and capacitor 996 together determine the flashing rate of LEDs 61 . . . 67. Resistor 992 determines the off-to-on ratio of the flashing cycle. Resistor 993 and capacitor 994 together determine the interval after which flashing ceases. Resistor 995 is used to reduce the supply voltage of −48 volts to about −5 volts.

Capacitor 990 causes a negative voltage to be applied to the trigger input, port 8, of timer 986 when power is applied, thereby initiating timing. At the end of the flashing interval, the output of timer 986 from port 9 goes from a high state to a low state. This forward biases diode 998 and holds port 6, the trigger input of timer 987, in the low state and inhibits flashing.

During the flashing interval the output from port 5 is a a square wave at substantially 2 Hertz and provides the base current for NPN transistor 997 through current limiting resistor 999. Transistor 997 drives a plurality of tracing lamps, LEDs 61, 63 . . . 67.

At the end of the flashing interval, the output from port 5 remains in the high state, and LEDs 61 . . . 67 remain on. The period set by capacitor 996 and resistor 991 produces about two flashes per second.

Resistor 993 and capacitor 994 set the interval, about one minute in the preferred embodiment, during which LEDs 61 . . . 67 are caused to flash. Resistor 991 and capacitor 996 determine the rate at which LEDs 61 . . . 67 are caused to flash. By these two separate means, the flashing interval and the rate of flashing are independently set.

What is claimed is:

1. Apparatus for interconnecting first and second digital systems, said apparatus being housed in a frame comprising upper and lower crossarms, said apparatus comprising
- a backplane having front and rear surfaces and housing a plurality of first terminals extending outwardly from said rear surface for terminating a plurality of circuits to and from said first and second digital systems,
- a housing unit connected mechanically and electrically to said backplane said housing unit having a plurality of second terminals for interconnecting said first and second digital systems, said housing unit having front and rear surfaces, said second terminals extending forwardly from said front surface of said housing unit,
- a resilient tang on the upper surface of said apparatus and adapted to be snapped removably into place in said upper crossarm within said frame for retaining said apparatus,
- a pedestal comprising anterior and posterior projections and a central recess in an upper surface of said pedestal facing a lower end of said housing unit to mate with said housing unit, said pedestal further comprising a longitudinal recess in a lower surface of said pedestal adapted to mate with said lower crossarm of said frame for retaining said apparatus, and
- a plurality of printed wiring boards within said apparatus for establishing an electrical path between said first terminals of said backplane and said second terminals on said front surface of said housing unit.

2. An improved apparatus for providing a location at which a circuit is established between first and second digital systems, said apparatus being housed in a frame having a plurality of horizontal crossarms, said apparatus which has front, rear, top and bottom surfaces comprising
- a plurality of first terminals on said rear surface of said apparatus for terminating conductors from said first and second digital systems,
- a plurality of second terminals on said front surface of said apparatus, said plurality of first and second terminals being interconnected by electrical paths through said apparatus, and
- a plurality of jacks on said front surface of said apparatus,
wherein the improvement in said apparatus comprises
- a pedestal having top and bottom surfaces said pedestal adapted to be removably mounted on the bottom surface of said apparatus, said pedestal comprising a longitudinal slot on said bottom surface of said pedestal so as to mate with the upper surface of a first one of said crossarms in said frame,
- a tang on the top surface of said apparatus, said tang being flexible and adapted to mate removably with a lower surface of a second one of said crossarms so as to hold said apparatus securely within said frame between said first and second crossarms, and
- said electrical paths comprising a plurality of electrical wires printed on a plurality of circuit boards within said apparatus.

3. The apparatus of claim 2 wherein said pedestal further comprises forward and rearward projecting sections, each of said sections comprising fanning strips, the upper surface of said fanning strips comprising respectively first and second longitudinal slots substantially parallel to said longitudinal slot which is on said bottom surface of said pedestal, said first longitudinal slot being used to mate with a substantially horizontal upper edge of a panel, said panel being substantially parallel to said first crossarm and connected thereto by a substantially horizontal member forming a trough in which is located jumper wires for interconnecting said second terminals,
- said forwardly projecting fanning strip being used to hold a plurality of said jumper wires which are used for interconnecting said second terminals, and said rearwardly projecting fanning strip being used to hold a plurality of conductors which connect said first terminals with said first digital system and with said second digital system.

4. The apparatus of claim 3 wherein said apparatus further comprises
- a backplane for housing said first terminals, and
- a housing unit for housing said second terminals and for providing said jack appearances.

5. The apparatus of claim 4 wherein said backplane comprises a flexible board which is bonded to a rigid board to provide support for said first terminals, said flexible board comprising a plurality of wiring paths printed thereon and connected to said first terminals and said flexible board further comprising a plurality of first finger-like terminations for said wiring paths and located on a contoured upper section of said flexible board.

6. The apparatus of claim 5 wherein said housing unit comprises
(1) a rigid wiring board having a printed wiring side and a component side, said printed wiring side having a plurality of second finger-like terminations for terminating wires printed on said wiring board so that said second finger-like terminations make contact with said plurality of first finger-like terminations, said wiring side of said rigid wiring board and said flexible board being separated by a plurality of insulating spacers,
(2) a plurality of electrical contacts,
(3) a rear section of said housing unit said rear section having front and rear surfaces and having a plurality of recesses for receiving and retaining therein said electrical contacts and said second terminals at said front surface, said rigid wiring board adapted to be fastened to said rear surface of said rear section,
(4) a grounding unit adapted to be fastened to said rear surface of said front section, and
(5) a front section of said housing unit said front section having front and rear surfaces said front section adapted to be fastened over said grounding unit, and said electrical contacts to said front surface of said rear section,
said electrical contacts being captivated between said rear section and front section of said housing, thereby facilitating automatic assembly of said contacts within said housing.

7. The apparatus of claim 6 wherein said front section of said housing unit further comprises a first row of a plurality of recesses, each recess receiving a light emitting diode, said diode making contact with one pair of said contacts.

8. The apparatus of claim 7 wherein said front surface of said front section comprises second, third and fourth rows of recesses, each of said recesses adapted to mate with a set of said contacts to form a jack.

9. The apparatus of claim 8 wherein said set of contacts which correspond with second row of recesses comprise a pair of long electrical contacts and a pair of short electrical contacts, said long contacts being aligned one above the other and said short contacts being aligned one above the other, and one short contact adjacent to one long contact, said long contact and said short contact not touching each other, said second row of jacks forming a plurality of monitor jacks.

10. The apparatus of claim 8 wherein each of the set of contacts in said third and fourth rows comprise two pairs of short electrical contacts, the contacts in each pair arranged one above the other and adjacent to each other so that in the normal position each contact within a pair touches the other.

11. The apparatus of claim 8 wherein said tang being resilient and having a substantially horizontal upper surface said tang projecting like a cantilever from said top surface of said front section, said upper surface of said tang rising substantially vertically to said horizontal surface for a predetermined height and then sloping towards the free end of said tang, said sloping surface facilitating said tang to yield to the lower surface of said second crossarm when said apparatus is being installed into said frame.

* * * * *